(12) United States Patent
Cho et al.

(10) Patent No.: US 11,410,026 B2
(45) Date of Patent: Aug. 9, 2022

(54) NEUROMORPHIC CIRCUIT HAVING 3D STACKED STRUCTURE AND SEMICONDUCTOR DEVICE HAVING THE SAME

(71) Applicant: SAMSUNG ELECTRONICS CO., LTD., Suwon-si (KR)

(72) Inventors: Woo-Yeong Cho, Suwon-si (KR); Seong-Il O, Suwon-si (KR); Hak-Soo Yu, Seoul (KR); Min-Su Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 938 days.

(21) Appl. No.: 16/191,906

(22) Filed: Nov. 15, 2018

(65) Prior Publication Data

US 2019/0318230 A1 Oct. 17, 2019

(30) Foreign Application Priority Data

Apr. 17, 2018 (KR) .................. 10-2018-0044534

(51) Int. Cl.
*G06N 3/063* (2006.01)
*G06N 3/04* (2006.01)
(Continued)

(52) U.S. Cl.
CPC ........... *G06N 3/063* (2013.01); *G06F 15/163* (2013.01); *G06N 3/04* (2013.01); *H01L 25/0657* (2013.01);
(Continued)

(58) Field of Classification Search
CPC ........ G06N 3/063; G06N 3/04; G06F 15/163; H01L 25/0657; H01L 27/2463;
(Continued)

(56) References Cited

U.S. PATENT DOCUMENTS 8,977,578 B1 3/2015 Cruz-Albrecht et al.
9,171,248 B2 10/2015 Heliot et al.
(Continued)

FOREIGN PATENT DOCUMENTS

CN 105789139 7/2016

OTHER PUBLICATIONS

Office Action dated Mar. 12, 2021 in corresponding Indian Application No. 201934008094 (6 pages).
(Continued)

*Primary Examiner* — Daniel D Chang
(74) *Attorney, Agent, or Firm* — F. Chau & Associates, LLC

(57) ABSTRACT

Provided are a neuromorphic circuit having a three-dimensional stack structure and a semiconductor device including the neuromorphic circuit. The semiconductor device includes a first semiconductor layer including one or more synaptic cores, each synaptic core including neural circuits arranged to perform neuromorphic computation. A second semiconductor layer is stacked on the first semiconductor layer and includes an interconnect forming a physical transfer path between synaptic cores. A third semiconductor layer is stacked on the second semiconductor layer and includes one or more synaptic cores. At least one through electrode is formed, through which information is transferred between the first through third semiconductor layers. Information from a first synaptic core in the first semiconductor layer is transferred to a second synaptic core in the third semiconductor layer via the one of more through electrodes and an interconnect of the second semiconductor layer.

27 Claims, 19 Drawing Sheets

(51) Int. Cl.
  *H01L 27/24* (2006.01)
  *H01L 25/065* (2006.01)
  *G06F 15/163* (2006.01)

(52) U.S. Cl.
  CPC .............. *H01L 27/2463* (2013.01); *H01L 2225/06541* (2013.01)

(58) Field of Classification Search
  CPC ......... H01L 2225/06541; H01L 23/481; H01L 23/49822; H01L 23/49827; H01L 23/535; H01L 27/0688
  See application file for complete search history.

(56) References Cited

U.S. PATENT DOCUMENTS

| | | | |
|---|---|---|---|
| 9,495,634 | B2 | 11/2016 | Modha |
| 9,501,739 | B2 | 11/2016 | Matsuoka et al. |
| 2010/0241601 | A1 | 9/2010 | Carson et al. |
| 2013/0185237 | A1 | 7/2013 | Heliot et al. |
| 2013/0272049 | A1 | 10/2013 | Vogt et al. |
| 2013/0293292 | A1 | 11/2013 | Droege et al. |
| 2015/0058268 | A1 | 2/2015 | Modha |
| 2017/0154257 | A1* | 6/2017 | Cao ............ G06N 3/04 |
| 2017/0185888 | A1 | 6/2017 | Chen et al. |
| 2018/0046908 | A1* | 2/2018 | Cox ............ G06F 3/06 |

OTHER PUBLICATIONS

Belhadj, et al., "The Improbable But Highly Appropriate Marriage of 3D Stacking and Neuromorphic Accelerators", 2014 Internationalconference on Compilers, Architecture and Synthesis Forembedded Systems (CASES), CM, Oct. 12, 2014 (Oct. 12, 2014), pp. 1-9, DOI: 10.1145/2656106.2656130).

Office Action dated Sep. 19, 2019 in corresponding Singapore Application No. 10201900011W (10 pages).

Hardware Architectures for Deep Neural Networks, MICRO Tutorial, Oct. 16, 2016, 300 pages.

Bipin Rajendran, et al., "Specifications of Nanoscale Devices and Circuits for Neuromorphic Computational Systems", IEEE Transactions on Electron Devices, vol. 60, No. 1, Jan. 2013, pp. 246-253.

European Search Report dated Jul. 22, 2019 in corresponding European Application No. 18213128.4 (9 pages).

Belhadj Bilel et al., "The Improbable But Highly Appropriate Marriage of 3D Stacking and Neuromorphic Accelerators", 2014 International Conference on Compilers, Architecture and Synthesis for Embedded Systems (CASES), ACM, Oct. 12, 2014, pp. 1-9.

MD Amimul Ehsan et al., "Neuromorphic 3D Integrated Circuit: A Hybrid, Reliable and Energy Efficient Approach for Next Generation Computing", Great Lakes Symposium on VLSI 2017, ACM, May 10, 2017, pp. 221-226.

* cited by examiner

NEUROMORPHIC CIRCUIT HAVING 3D STACKED STRUCTURE AND SEMICONDUCTOR DEVICE HAVING THE SAME

CROSS-REFERENCE TO RELATED APPLICATION

This application claims the benefit under 35 U.S.C. § 119 of Korean Patent Application No. 10-2018-0044534, filed on Apr. 17, 2018, in the Korean Intellectual Property Office, the disclosure of which is incorporated herein by reference in its entirety.

TECHNICAL FIELD

This disclosure relates generally to a semiconductor device, and more particularly, to a semiconductor device including a neuromorphic circuit.

DISCUSSION OF THE RELATED ART

Research is being conducted for implementing neuromorphic circuits mimicking the human brain, which involves designing neural circuits and synapse circuits respectively corresponding to neurons and synapses of the human nerve system. Realization of a semiconductor chip including a neuromorphic circuit ("neuromorphic chip") employs, along with synaptic cores including neuron groups, routers in the semiconductor device for multiple input and output connections between synaptic cores. In this regard, a circuit that facilitates multiple input and output connections and data transmission and reception is desirable to mimic the human nerve system having sophisticated connections.

SUMMARY

The inventive concept provides a neuromorphic circuit having a three-dimensional stack structure and capable of emulating a high-performance nervous system by facilitating multiple input and output connections.

According to an aspect of the inventive concept, there is provided a semiconductor device including first, second and third semiconductor layers. The first semiconductor layer includes one or more synaptic cores, each synaptic core comprising neural circuits arranged to perform neuromorphic computation. The second semiconductor layer is stacked on the first semiconductor layer and includes an interconnect forming a physical transfer path between synaptic cores. The third semiconductor layer is stacked on the second semiconductor layer and includes one or more synaptic cores. One more through electrodes are formed, through which information is transferred between the first through third semiconductor layers. Information from a first synaptic core in the first semiconductor layer is transferred to a second synaptic core in the third semiconductor layer via the one or more through electrodes and the interconnect of the second semiconductor layer.

According to another aspect of the inventive concept, there is provided a neuromorphic circuit including: a synaptic core layer including a plurality of synaptic cores, each synaptic core comprising a plurality of neural circuits and a memory array storing synapse information; global routers each configured to determine an information transfer path between the synaptic cores; and a global interconnect layer forming a physical transfer path between the global routers. The synaptic core layer and the global interconnect layer are arranged in a stack structure, and information from a synaptic core of the synaptic core layer is transferred to the global interconnect layer via one or more through electrodes.

According to another aspect of the inventive concept, there is provided an operating method of a semiconductor device, in which the semiconductor device includes a plurality of semiconductor layers with circuitry communicating with each other via a through silicon via (TSV). The operating method involves: transferring information from a first synaptic core including a plurality of neural circuits formed in a first semiconductor layer to a first router associated with the first synaptic core; transferring the information from the first router to a second router via an interconnect formed in a second semiconductor layer stacked on the first semiconductor layer; and transferring the information from the second router to a second synaptic core formed in a third semiconductor layer stacked on the second semiconductor layer, where the second synaptic core is associated with the second router.

According to still another aspect of the inventive concept, a semiconductor device includes first, second and third semiconductor layers. The first semiconductor layer comprises processing elements of a parallel processing system. The second semiconductor layer is stacked on the first semiconductor layer and comprises an interconnect forming a physical transfer path between processing elements. The third semiconductor layer is stacked on the second semiconductor layer and comprises processing elements. One or more through electrodes is disposed within at least one of the first, second and third layers, through which information is transferred between the first through third semiconductor layers. Information from a first processing element in the first semiconductor layer is transferred to a second processing element in the third semiconductor layer via the one or more through electrodes and the interconnect of the second semiconductor layer.

BRIEF DESCRIPTION OF THE DRAWINGS

Embodiments of the inventive concept will be more clearly understood from the following detailed description taken in conjunction with the accompanying drawings in which like reference characters denote like elements or functions, wherein.

DETAILED DESCRIPTION OF EMBODIMENTS

Embodiments of the inventive concept will now be described below with reference to the accompanying drawings.

Figure 1:
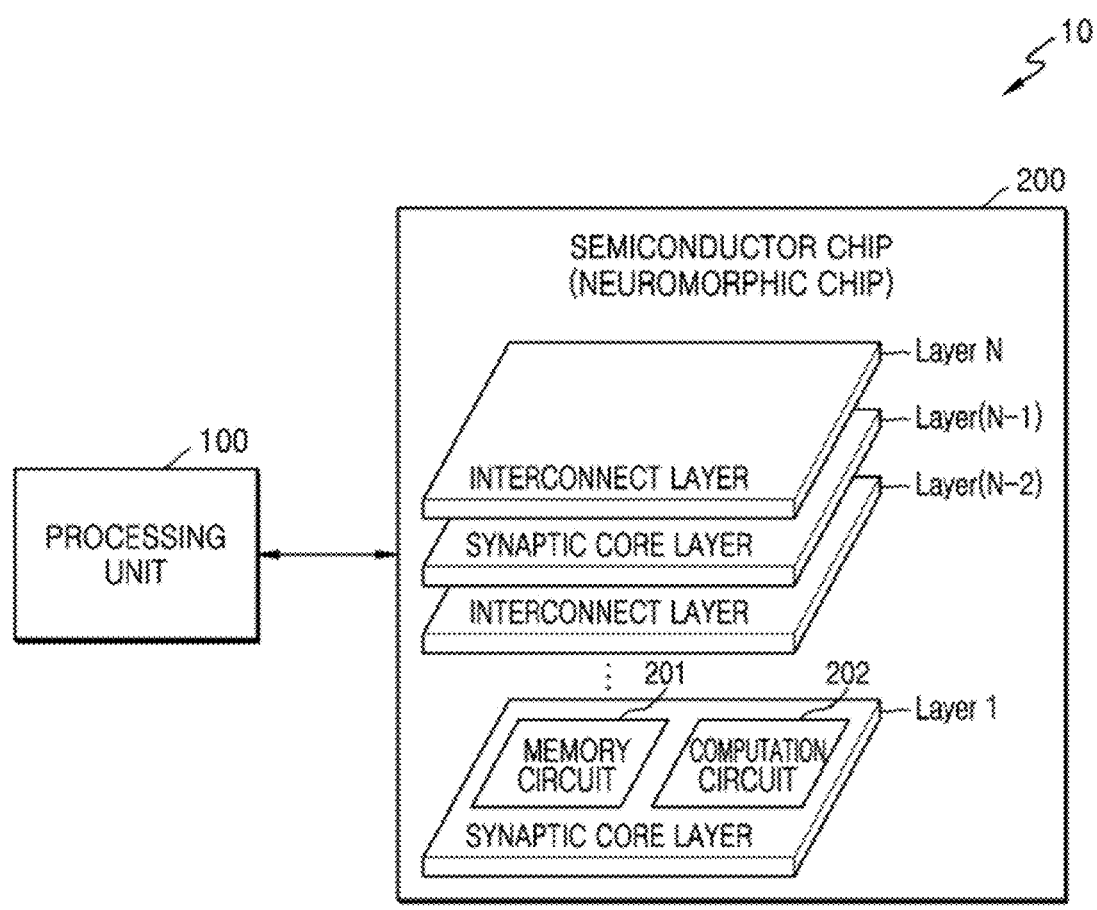
FIG. 1 is a block diagram illustrating a data processing system according to an embodiment of the inventive concept.

FIG. 1 is a block diagram illustrating a data processing system 10 according to an embodiment of the inventive concept. Data processing system 10 may include a processing unit 100 and a semiconductor device 200. The processing unit 100 may be any of various types of execution processing units, such as a central processing unit (CPU), a hardware accelerator such as a field-programmable gate array (FPGA), a massively parallel processor array (MPPA), a graphics processing unit (GPU), an application-specific integrated circuit (ASIC), a neural processing unit (NPU), a tensor processing unit (TPU) or a multi-processor system-on-chip (MPSoC).

The data processing system 10 may be a system processing various types of data, and may be a system performing artificial intelligence computation such as neuromorphic computation or neural network computation according to an embodiment. For example, at least a portion of neuromorphic computation may be performed by circuitry on the semiconductor device 200, and an intermediate result or a final result of neuromorphic computation may be recorded to a memory in the semiconductor device 200 or read from the semiconductor device 200. In addition, the semiconductor device 200 may include a memory array storing information during a process of neuromorphic computation or neural network computation. The processing unit 100 may include a memory controller (not shown) for controlling a read/write operation on such a memory array.

For example, the data processing system 10 may be implemented as a personal computer (PC), a data server, a cloud system, an artificial intelligence server, a network-attached storage (NAS), an Internet of Things (IoT) device, or a portable electronic device. In addition, when the data processing system 10 is a portable electronic device, the data processing system 10 may be a laptop computer, a mobile device, a smartphone, a tablet PC, a personal digital assistant (PDA), an enterprise digital assistant (EDA), a digital still camera, a digital video camera, an audio device, a portable multimedia player (PMP), a personal navigation device (PND), a MP3 player, a handheld game console, an e-book, a wearable device or the like.

According to an embodiment, the data processing system 10 performs neuromorphic computation, and the semiconductor device 200 may include neural circuits and synapse circuits respectively corresponding to neurons and synapses present in the human nervous system, as hardware components. Here, since the semiconductor device 200 performs neuromorphic computation, the semiconductor device 200 may be referred to as a neuromorphic device or a neuromorphic chip or integrated circuit (IC). A neuromorphic chip may include various circuit components mathematically modeling real neurons, and may include, for example, a memory array used to store synapse information or perform weight multiplication, or an operator performing an accumulation computation of weight-reflected multiple inputs or an activation function operation. A neuromorphic chip may be used in various fields such as data classification, pattern recognition or the like.

According to an embodiment of the inventive concept, the semiconductor device 200 may include a plurality of three-dimensionally stacked semiconductor layers to implement the neuromorphic computation function as described above. For example, the semiconductor device 200 may include first through Nth semiconductor layers Layer 1 through Layer N (hereafter, just "Layer 1 through Layer N", for brevity), where Layer 1 through Layer N may include: synaptic cores performing neuromorphic computation; at least one router arranged to correspond to each synaptic core to control transfer of information such as a computation input or a computation result (or to determine an information transfer path); and interconnects arranged between routers to form a physical transfer path. Herein, a physical transfer path may be an electrical or optical transfer path configured for transferring information or control signals between circuits that are connected to the physical transfer path at different points.

The semiconductor device 200 may be implemented as a semiconductor chip, IC, or a semiconductor package in which layers Layer 1 through Layer N are stacked, and information may be exchanged between Layer 1 through Layer N via conductive lines such as through electrodes. For example, although not illustrated in FIG. 1, a through silicon via (TSV) may be further included in the semiconductor device 200 as a through electrode.

For example, synaptic cores may be arranged in some of layers Layer 1 through Layer N, and these semiconductor layers may be referred to as synaptic core layers. In addition, in other semiconductor layers among Layer 1 through Layer N, interconnects may be arranged, and these semiconductor layers may be referred to as interconnect layers. Further, routers may be arranged in the synaptic core layers and/or the interconnect layers.

Each synaptic core layer may include a plurality of synaptic cores, where a plurality of neural circuits and synaptic circuits may be implemented in each synaptic core. According to an embodiment, each synaptic core may include a memory circuit 201 storing synapse information for calculating weights between neural circuits and a computation circuit 202 including various operators for neuromorphic computation. For example, the memory circuit 201 may include a reconfigurable memory array, and the computation circuit 202 may include logic to perform a computation function such as data multiplication, summation, and activation function operations or the like that are associated with neuromorphic computation.

Each synaptic core may further include local routers used to control information transfer between neural circuits within that synaptic core, and local interconnects used to form a physical transfer path between local routers. Semiconductor device 200 may further include routers for information transfer between the synaptic cores, which may be referred to as global routers, and information transfer paths between the global routers, which may be referred to as global interconnects.

In an embodiment, the synaptic core layers and the interconnect layers of Layers 1 through N may be alternately stacked. For example, first, third, . . . , and (N−1)th semiconductor layers Layer 1, Layer 3, . . . , Layer (N−1) may be synaptic core layers, and second, fourth, . . . , Nth semiconductor layers Layer 2, Layer 4, . . . Layer N may be interconnect layers.

According to an operation example, Layer 1 may be a synaptic core layer, and input information from the processing unit 100 or another semiconductor layer may be provided to a first synaptic core in Layer 1. The first synaptic core may perform a neuromorphic computation by using input information and a weight, and may provide a computation result to Layer 2, which is an interconnect layer. The computation result may be transferred via an interconnect of Layer 2 to a second synaptic core of Layer 1 via transfer path control, or the computation result may be provided to a third synaptic core of Layer 3.

With semiconductor device 200, information may be transferred in various manners between multiple semiconductor layers according to the above-described structure. For example, a synaptic core in any one synaptic core layer may receive input information from any other synaptic core layer, and may provide a computation result to any other synaptic core layer.

According to the above-described embodiment of the inventive concept, and as will be described further below, since synaptic cores, routers, and interconnects are implemented as a three-dimensional stack in semiconductor layers, this facilitates the implementation of a high-capacity brain-like structure and the handling of multiple inputs and outputs therein. In addition, due to a higher capacity of each chip unit, the number of semiconductor chips needed for actual neuromorphic computation may be reduced, and accordingly, chip-to-chip connections may be reduced, thereby reducing a system size and enabling low-power consumption.

Meanwhile, information transmission between Layer 1 through Layer N as described above may be performed by using elements such as a TSV. For example, a TSV formed in at least one of adjacent semiconductor layers may allow for information exchange between the adjacent layers. In an embodiment (illustrated later), a TSC may pass through all of the layers Layer 1 through Layer N.

While the semiconductor device 200 has been described as one that performs a neuromorphic computation, the inventive concept is not limited thereto. For example, processing circuitry performing a neural network computation according to a predefined neural network model based on control of the processing unit 100 may be included in some semiconductor layers of the semiconductor device 200.

Some examples of the neural network model may include various types of models such as Convolutional Neural Networks (CNN), Recurrent Neural Networks (RNN), Deep Belief Networks, Restricted Boltzman Machines. For instance, a portion of neural network computation may be performed by using the processing unit 100, and another portion thereof may be performed by using the semiconductor device 200. In this case, when the semiconductor device 200 performs neural network computation, it may do so based on input data received from the processing unit 100 and provide a computation result to the processing unit 100, or may generate an information signal based on the computation result and provide the information signal to the processing unit 100.

Figure 2:
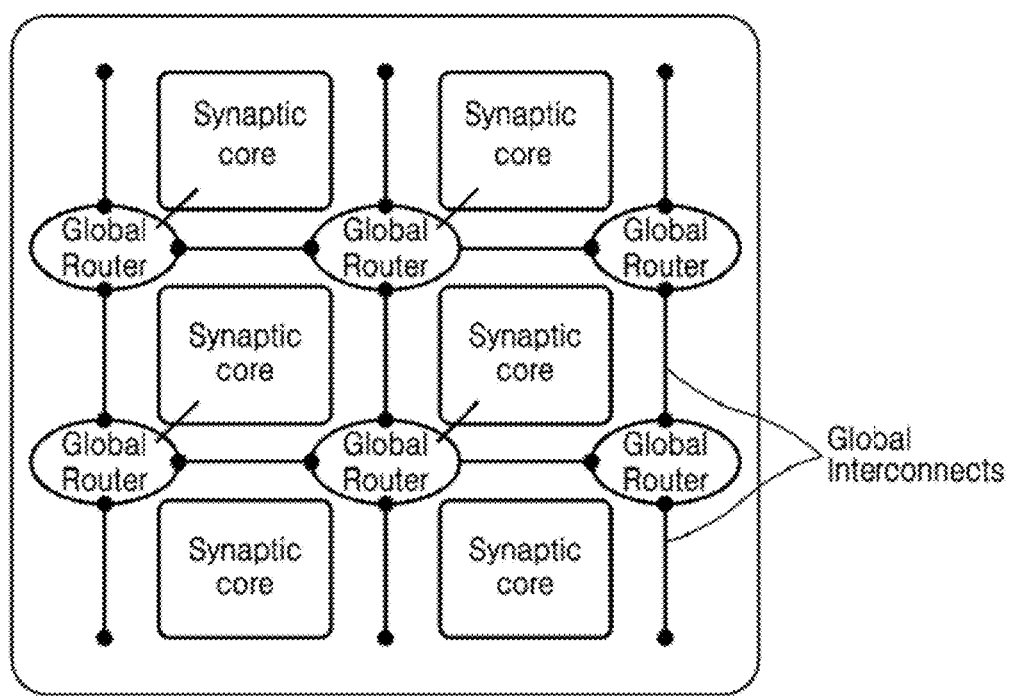
FIG. 2 is a block diagram illustrating an example of elements for realizing a neuromorphic chip function.

FIG. 2 is a block diagram illustrating an example of elements and connections therebetween for implementing a neuromorphic chip function. While the elements are illustrated two-dimensionally in FIG. 2 for ease of explanation, according to embodiments of the inventive concept, the elements illustrated in FIG. 2 may be arranged three-dimensionally.

A neuromorphic chip may include a plurality of synaptic cores, a plurality of routers corresponding to the synaptic cores, and interconnects via which information is transferred between the routers. For example, at least one router may be provided in association with each synaptic core. As described above, routers and interconnects between the synaptic cores may be respectively referred to as global routers and global interconnects. In the example arrangement of FIG. 2, one global router is connected to each respective synaptic core, and the global routers electrically or optically connect to one another via global interconnects. The shown elements of FIG. 2 may be disposed in one or more of Layer 1 to Layer N of FIG. 1. It is noted that the global routers may be reconfigurable routers functioning as a gate for signal connection between the synaptic cores.

A synaptic core may represent a plurality of neuron assemblies, and may include a memory array storing synapse information. In addition, while not illustrated in FIG. 2, a synaptic core may include local routers and local interconnects for information transfer between a plurality of neural circuits.

Each synaptic core may receive input information through a global router, and transmit a computation result obtained by using the input information through the global router. For example, each synaptic core may provide a computation result and also output, through the global router, path information leading to another synaptic core which is to receive the computation result. The computation result may be provided to at least one other synaptic core through interconnects between global routers. In a neuromorphic chip having a three-dimensional structure according to embodiments of the inventive concept, each synaptic core may further output, through the global router, information indicating a semiconductor layer where the other synaptic core(s) is located, to facilitate information transmission between a plurality of semiconductor layers.

Meanwhile, routing information may be stored in the synaptic core to control an information transfer path through the associated global router, and a memory array used to store routing information may be implemented as part of a memory array used to implement a neural circuit in the synaptic core. Alternatively, the memory array for storing routing information is implemented in a separate memory area.

The global interconnects and the local interconnects described above may be formed of various types of materials having electric conductivity or of an optical material.

Figure 3:
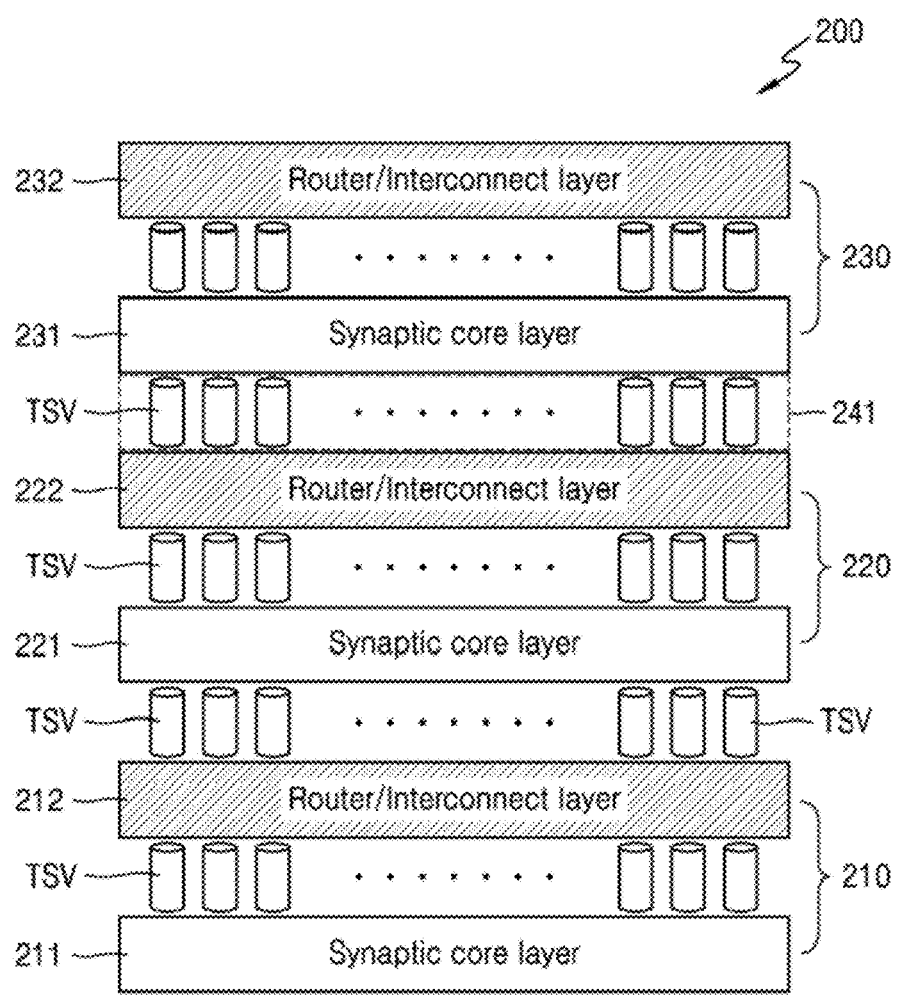
FIG. 3 is a structural diagram illustrating an example of a semiconductor device of FIG. 1.

FIG. 3 is a structural diagram illustrating an example of the semiconductor device 200 of FIG. 1. As shown in FIG. 3, the semiconductor device 200 may include a plurality of semiconductor layers that communicate with each other via a TSV. (Each of the cylinders shown in FIG. 3 and other figures discussed hereafter is a TSV.) Note that while six semiconductor layers are illustrated in FIG. 3 (aside from the silicon layers 241), any suitable number of semiconductor layers may be used. Hereafter, a semiconductor layer in which at least one synaptic core is disposed may be referred to as a synaptic core layer, and a semiconductor layer in which a router and/or an interconnect is disposed may be referred to as a router/interconnect (R/I) layer. Here, it is assumed that one synaptic core layer and one router/interconnect layer form one layer set. In the below discussion, "interconnects" are understood to be global interconnects, and "routers" are understood to be global routers, unless indicated otherwise.

The semiconductor device 200 may include first through third layer sets 210 through 230. The first layer set 210 may include a first synaptic core layer 211 and a first router/interconnect layer 212. The first router/interconnect layer 212 may be stacked on the first synaptic core layer 211 and may communicate with the first synaptic core layer 211 via a TSV. In addition, the second layer set 220 may be stacked on the first layer set 210 via a TSV and include a second synaptic core layer 221 and a second router/interconnect layer 222. In addition, the second router/interconnect layer 222 may be stacked on the second synaptic core layer 221 and may communicate with the second synaptic core layer 221 via a TSV. The third layer set 230 may also include a third synaptic core layer 231 and a third router/interconnect layer 232.

As mentioned, each of the cylinders shown in FIG. 3 and other figures discussed hereafter is a TSV, thus it is seen that a set of TSVs between adjacent semiconductor layers may be used to communicatively connect circuits in different layers to one another. Although shown to exist with a layer thickness between adjacent semiconductor layers such as 211, 212, the TSVs may exist entirely within the semiconductor layers such as 211, 212. In this case, when adjacent layers are said to be "stacked on" each other, surfaces of the adjacent layers may be in direct contact without any additional semiconductor layer therebetween. Alternatively, each set of TSVs may be formed at least partially within a separate silicon layer 241, and each TSV may or may not extend within the adjacent layers such as 211, 212 but may instead make electrical contact with conductive traces on the surfaces of the adjacent layers. In either case, when one layer is said herein to be stacked on another layer, the surfaces of the two layers may be in direct contact (as in the case where the TSVs are disposed entirely within the respective layers), or they may be spaced closely together but not in direct contact (as in the case where the TSVs are provided at least partially within a separate layer 241).

At least one router may be arranged to correspond to each synaptic core. Herein, a router said to be arranged to correspond to a synaptic core, or to just correspond to a synaptic core, is a router associated with, and directly connected to, that synaptic core for signal communication. For example, one synaptic core and one router corresponding to this synaptic core may be arranged in semiconductor layers at different locations. Alternatively, two or more routers may be associated with any one synaptic core. For instance, with regard to one synaptic core with all its elements entirely within any one semiconductor layer, routers corresponding to this synaptic core may be arranged in different semiconductor layers located above and below the one semiconductor layer.

In the semiconductor device 200 illustrated in FIG. 3, with regard to a synaptic core, a router, and an interconnect included to implement a neuromorphic chip, an R/I layer that includes both the router and the interconnect, and a synaptic core layer that includes the synaptic core having a memory array, may be separated but connected to each other by using a TSV connection technique.

According to an operation example, a plurality of synaptic cores may be arranged in the first synaptic core layer 211, and information from any one of the synaptic cores may be provided to the first R/I layer 212 via a TSV. The information provided to the first R/I layer 212 may be provided to the second synaptic core layer 221 of the second layer set 220 or the third synaptic core layer 231 of the third layer set 230 via a TSV formed on the first R/I layer 212. In another connection path, the information provided to the first R/I layer 212 may be provided to another synaptic core in the first synaptic core layer 211 via a TSV formed under the first R/I layer 212.

Similarly, information from a synaptic core in the second synaptic core layer 221 may be transmitted to another synaptic core via a TSV on or under the second synaptic core layer 221. For example, information from a synaptic core in the second synaptic core layer 221 may be provided to a synaptic core in the third synaptic core layer 231 through a TSV on the second synaptic core layer 221 and the second R/I layer 222. Alternatively, information from a synaptic core in the second synaptic core layer 221 may be provided to a synaptic core in the second synaptic core layer 221 through a TSV under the second synaptic core layer 221 and the first R/I layer 212. Alternatively, information from a synaptic core in the second synaptic core layer 221 may be provided to another synaptic core in the second synaptic core layer 221 through a TSV on or under the second synaptic core layer 221.

Figure 4:
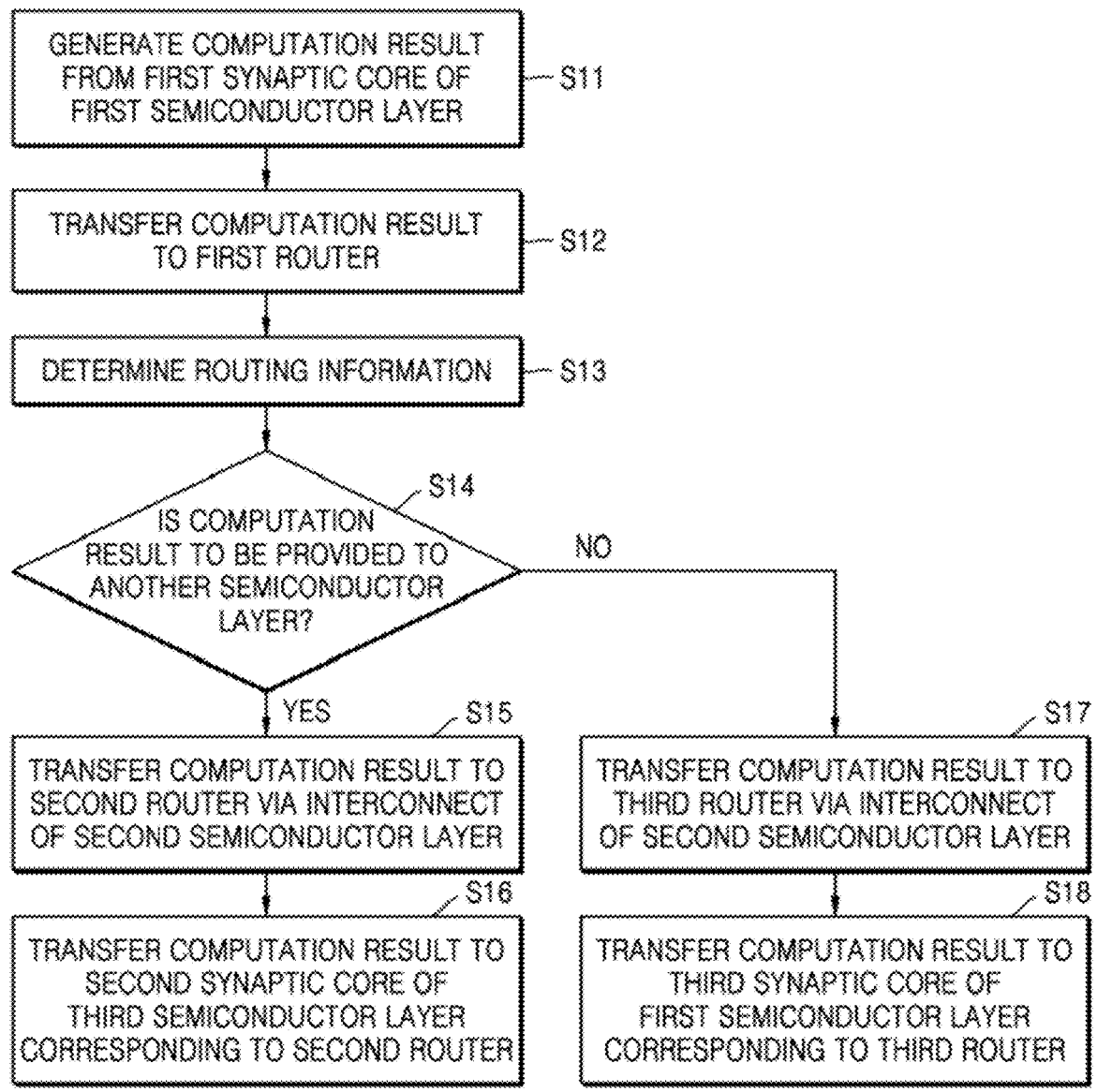
FIG. 4 is a flowchart of an operating method of a semiconductor device according to an embodiment of the inventive concept.

FIG. 4 is a flowchart of an operating method of a semiconductor device according to an embodiment of the inventive concept. As the semiconductor device is assumed as performing neuromorphic computation, the operating method of FIG. 4 may correspond to a neuromorphic computation method.

Referring to FIG. 4, the semiconductor device may include a plurality of semiconductor layers that are stacked three-dimensionally; for example, first through third semiconductor layers may be sequentially stacked. In addition, the first through third semiconductor layers may communicate with each other via a through electrode such as a TSV, and a synaptic core as described above may be arranged in each of the first through third semiconductor layers, and an interconnect (e.g., a global interconnect) may be arranged in the second semiconductor layer.

First, a first synaptic core in the first semiconductor layer may perform neuromorphic computation based on input information, and a computation result may be generated from the first synaptic core (S11). The computation result may be transferred to a first router associated with the first synaptic core (S12). According to an embodiment, the first router may be arranged in the second semiconductor layer in addition to an interconnect. The first router may receive routing information associated with information transfer, along with the computation result and determine the routing information (S13), and may determine a location of a semiconductor layer to which the computation result is to be provided. For example, it may be determined (S14) whether the computation result is to be provided to another semiconductor layer.

The computation result may be provided to a synaptic core located in the first semiconductor layer or another semiconductor layer based on a result of the determination. For example, when the computation result is provided to the third semiconductor layer located on the first semiconductor layer, the computation result may be provided to a second router via an interconnect of the second semiconductor layer (S15), and the computation result may be provided to a second synaptic core of the third semiconductor layer corresponding to the second router (S16). On the other hand, when the computation result is provided to another synaptic core of the first semiconductor layer, the computation result may be provided to a third router via the interconnect of the second semiconductor layer (S17), and the computation result may be provided to a third synaptic core of the first semiconductor layer corresponding to the third router (S18).

Figure 5A:
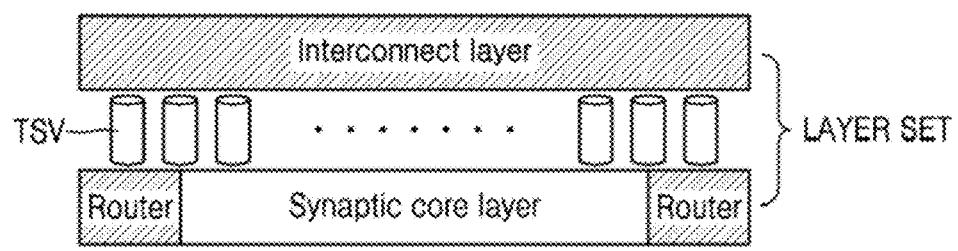
FIG. 5A illustrates a structural diagram of a layer set of a semiconductor device according to an embodiment.

FIG. 5A illustrates a structural diagram of a layer set of a semiconductor device according to an embodiment. The layer set includes a synaptic core layer having at least one synaptic core and a plurality of routers, an interconnect layer, and a set of TSVs between the synaptic core layer and the interconnect layer. In this case, the interconnect layer may exclude routers. By way of example, interconnects in this interconnect layer may be laid out in two vertical levels, where one vertical level includes a plurality of first interconnects running parallel to each other in a first direction, and the other vertical level includes a plurality of second interconnects running parallel to each other in a second direction orthogonal to the first direction. Alternatively, parallel running interconnects may be provided on just a single level within the interconnect layer. Other layouts are also contemplated, such as a plurality of concentric circular, square, or other shaped interconnects on the same or different levels within the interconnect layer.

Figure 5B:
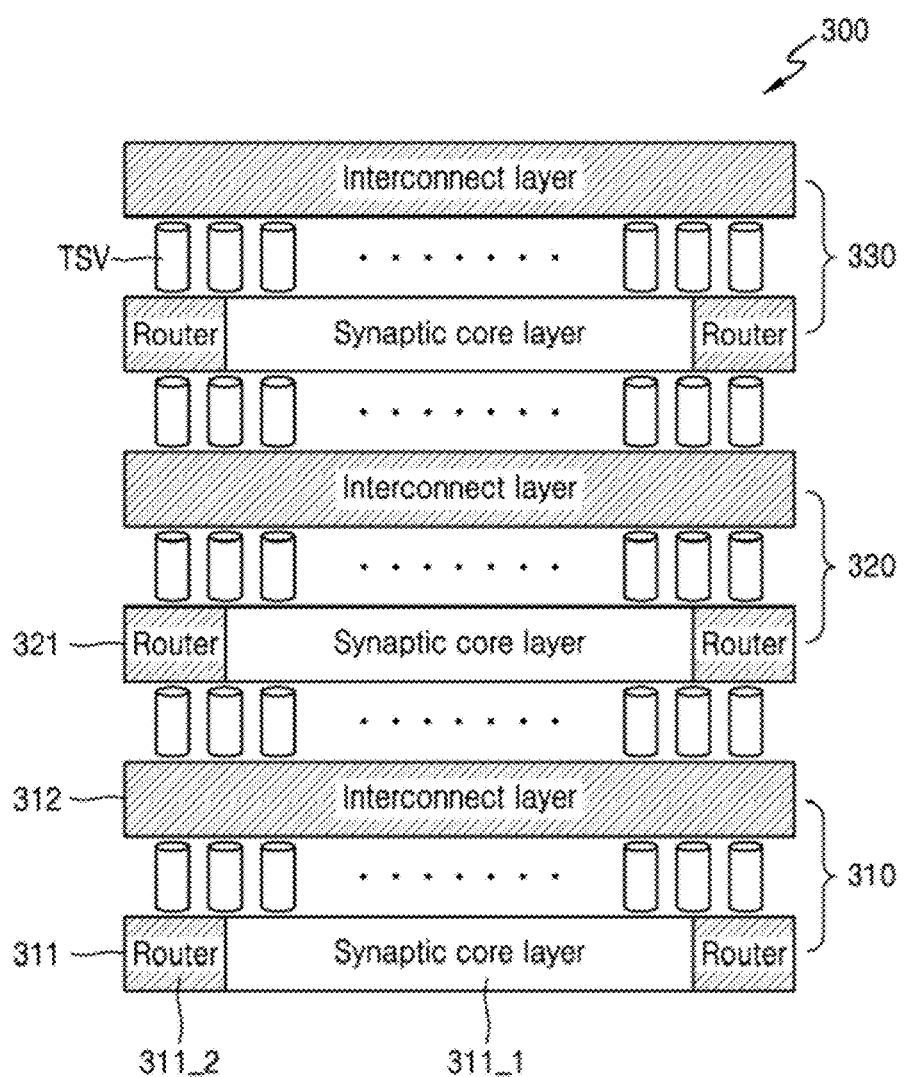
FIG. 5B is a structural diagram illustrating a semiconductor device according to another embodiment of the inventive concept.

FIG. 5B illustrates a semiconductor device 300 according to another embodiment of the inventive concept. Semiconductor device 300 includes a plurality of stacked layer sets each having the configuration of the layer set of FIG. 5A. The layer sets may include, e.g., first through third layer sets 310 through 330. First layer set 310 may include a first synaptic core layer 311 in which at least one synaptic core 311_1 and at least one router 311_2 are arranged and a first interconnect layer 312 in which an interconnect is arranged, and the first synaptic core layer 311 and the first interconnect layer 312 may communicate with each other via a TSV. The second and third layer sets 320 and 330 may also be configured in the same manner as the first layer set 310 and stacked on the first layer set 310, and as a TSV is formed between the first through third layer sets 310 through 330, information may be transmitted between the first through third layer sets 310 through 330 via the TSV.

For example, regarding the first layer set 310, information from synaptic cores in the first synaptic core layer 311 (for example, a computation result) may be provided to routers implemented in the same semiconductor layer, and then provided to the first interconnect layer 312 via a router and a TSV. For example, information from a first synaptic core in the first synaptic core layer 311 may be transferred via an interconnect formed in the first interconnect layer 312, and provided to a second synaptic core in the second synaptic core layer 321 through a router formed in the second synaptic core layer 321. In another connection path, information from the first synaptic core in the first synaptic core layer 311 may be transferred via an interconnect formed in the first interconnect layer 312, and then provided to a third synaptic core in the first synaptic core layer 311 via a router formed in the first synaptic core layer 311.

Figure 6:
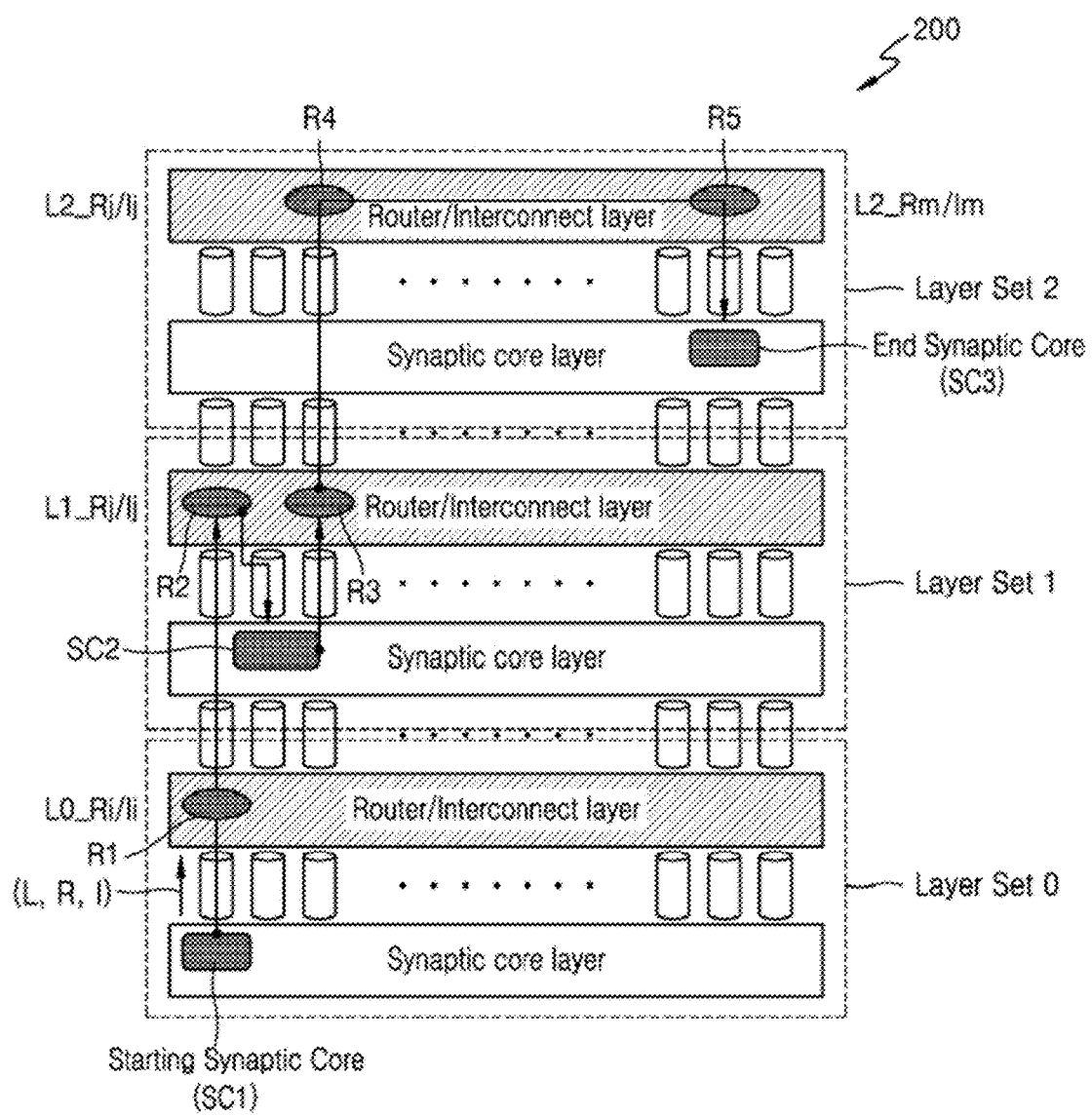
FIG. 6 illustrates an example of information transfer between synaptic cores within the semiconductor device of FIG. 3.

FIG. 6 illustrates an example of information transfer between synaptic cores within an example configuration of semiconductor device 200 of FIG. 3. The principles illustrated and described may also apply to other semiconductor device configurations.

As shown in FIG. 6, semiconductor device 200 includes a plurality of layer sets; for example, first through third layer sets Layer Set 0 through Layer Set 2 are illustrated. In addition, each layer set may include one synaptic core layer and one router/interconnect layer. Information from a starting synaptic core may be provided to an end synaptic core via at least one router and at least one a synaptic core. In the example depicted, information from a first synaptic core SC1 in the first layer set Layer Set 0 is provided to a third synaptic core SC3 in the third layer set Layer Set 2.

Along with information such as a computation result, the first synaptic core SC1 may further generate path information (or connection information) to a synaptic core (for example, a second synaptic core SC2) to which the computation result is to be transferred. For example, the path information may include information indicating a router or a synaptic core to which a computation result is to be provided. According to an embodiment, the path information may include layer information L, router information R, and interconnect information I.

For example, information from the first synaptic core SC1 may be provided to a corresponding router R1 located in the first layer set Layer Set 0, and the router R1 may decode the path information from the first synaptic core SC1. In addition, a transfer path of a computation result may be controlled based on a decoding result, and for example, a computation result may be provided to a second router R2 corresponding to a position Rj in the second layer set Layer Set 1 based on layer information L and interconnect information I included in the path information. In addition, the computation result may be provided to the second synaptic core SC2 corresponding to the second router R2, and the second synaptic core SC2 may generate a computation result based on received information, and may also generate path information (layer information L, router information R, and interconnect information I) used to control a path through which the computation result is to be transferred.

According to the above-described process, the computation result may be transferred via routers R4 and R5 in the third layer set Layer Set 2, and the computation result may be provided to the third synaptic core SC3 corresponding to the fifth router R5.

Note that the operations explained for FIG. 6 may also apply to the semiconductor device 300 of FIG. 5B, except that the routers are disposed within the synaptic core layers.

Figure 7A:
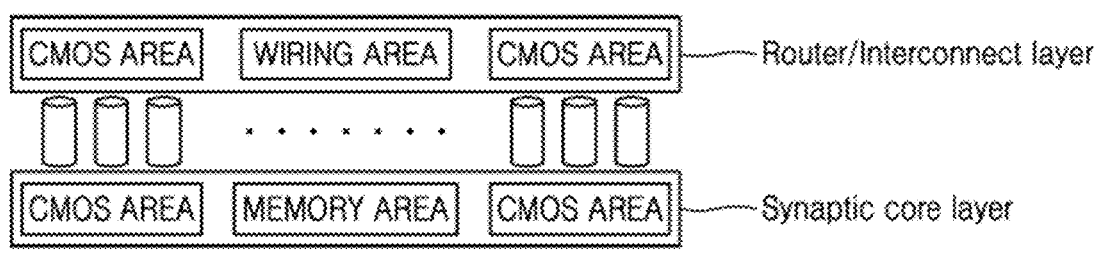
FIGS. 7A and 7B are configurational/block diagrams illustrating respective implementation examples of semiconductor layers according to a locations of a router.
Figure 7B:
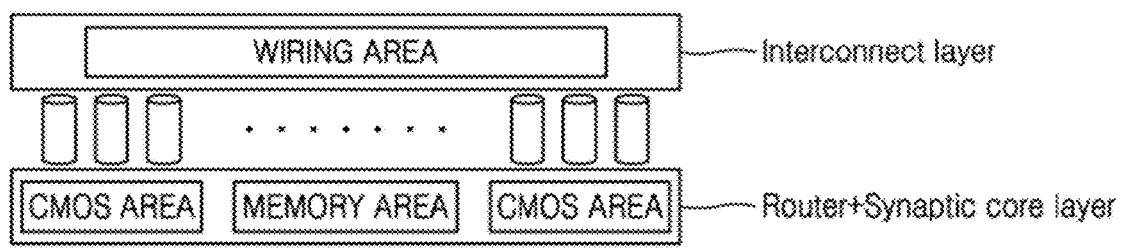

FIGS. 7A and 7B are block diagrams illustrating respective implementation examples of semiconductor layers according to locations of routers. In FIG. 7A, a router is arranged in the same layer as an interconnect, and in FIG. 7B, a router is arranged in the same layer as a synaptic core.

Referring to FIG. 7A, a router may be arranged in the same layer as an interconnect and include a complementary metal oxide semiconductor (CMOS) circuit used to decide a direction toward a synaptic core to which information is to be transferred. In addition, an interconnect may include a physical wiring area that forms a transfer path of information. Along with this, the synaptic core may include a memory area for storing synapse information or the like and a CMOS circuit area used to perform computation.

In the embodiment of FIG. 7B, as a router is arranged in the same layer as a synaptic core, only a physical wiring area that forms a transfer path of information may be formed in an interconnect layer. Meanwhile, in a router/synaptic core layer where a router and a synaptic core are arranged, the above-described memory area may be formed in addition to a CMOS circuit area that functions as a router and is used for neuromorphic computation.

According to the embodiment illustrated in FIG. 7A, a relatively large number of synaptic cores may be arranged in a synaptic core layer, and as a transfer path of information is formed by the router/interconnect layer, information may be transferred easily and efficiently. In addition, according to the embodiment illustrated in FIG. 7B, as only a physical wiring area may be formed in the interconnect layer, the interconnect layer may be easily implemented and the manufacturing costs may be reduced.

Figure 8A:
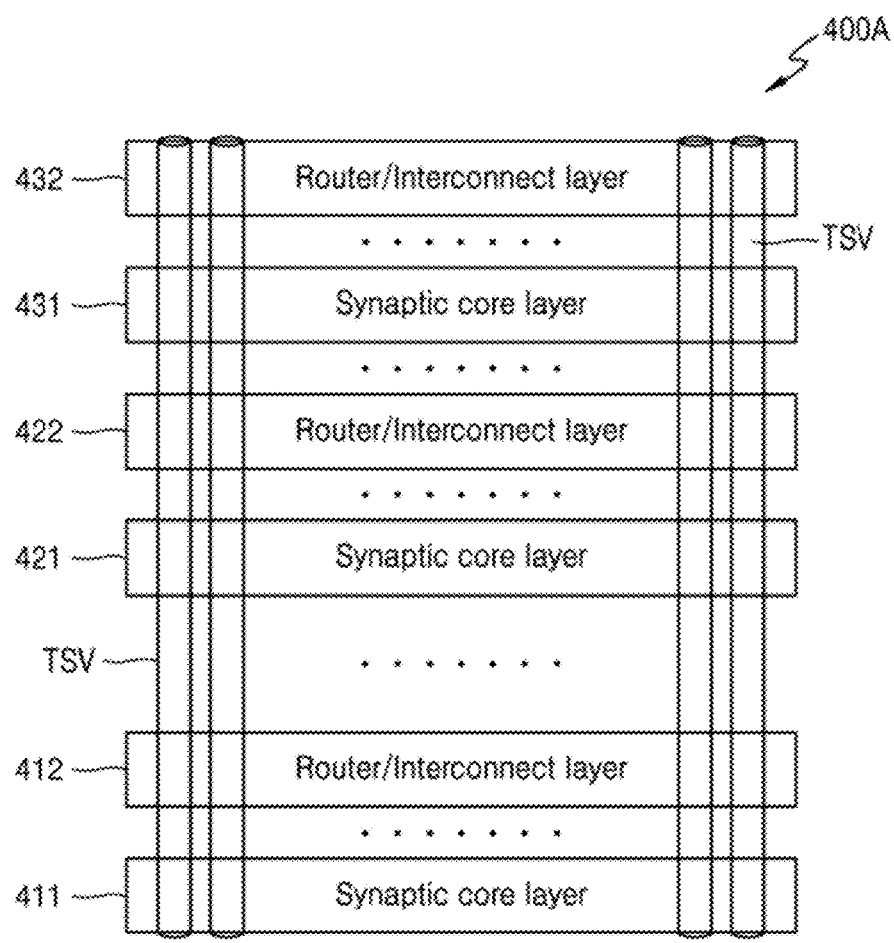
FIGS. 8A and 8B are configurational/block diagrams illustrating an implementation example of a through silicon via (TSV) according to embodiments of the inventive concept.
Figure 8B:
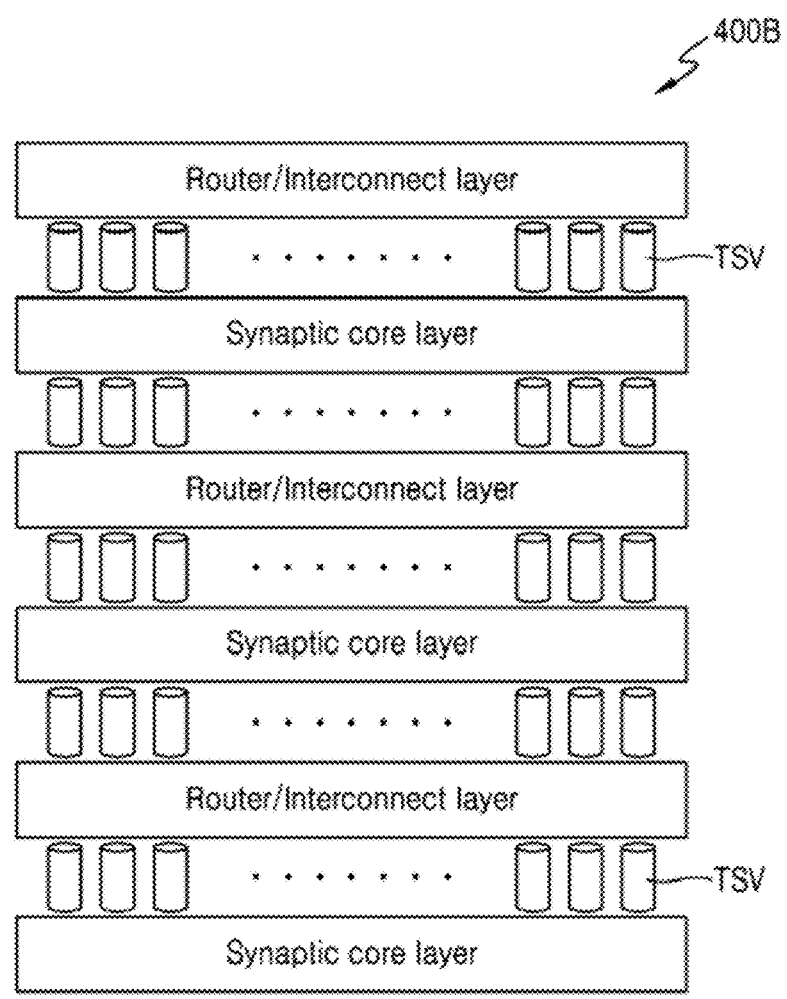

FIGS. 8A and 8B are block diagrams illustrating respective implementation examples of TSVs included in a semiconductor device 400A and 400B, respectively, according to embodiments of the inventive concept.

Referring to FIGS. 8A and 8B, the semiconductor device includes a plurality of semiconductor layers and TSVs for communication between the semiconductor layers, where the plurality of semiconductor layers may include synaptic core layers and router/interconnect layers that are alternately stacked vertically. In FIG. 8A, an example in which a plurality of semiconductor layers are arranged and then each TSV is formed to pass through all of the semiconductor layers is illustrated. A TSV in this embodiment may thus be referred to as a "multi-layer TSV". In other examples, multi-layer TSVs may be provided to extend through only some of the semiconductor layers. Still other examples may utilize a combination of multi-layer TSVs and "adjacent-layer TSVs" (TSVs that only connect circuit elements of adjacent semiconductor layers, as in the examples seen earlier and in FIG. 8B). In the embodiment of FIG. 8B, as illustrated in the above-described embodiments of FIG. 3, etc., each TSV is an "adjacent layer TSV" formed between just two adjacent semiconductor layers. In addition, while routers used to control an information transfer path are arranged in an interconnect layer in the embodiments of FIGS. 8A and 8B, the routers may also or alternatively be arranged in a synaptic core layer as in FIG. 5B.

According to the embodiment of FIG. 8A, information output from a synaptic core in the first semiconductor layer 411 may be directly transferred to an R/I layer that is not adjacent to the first semiconductor layer 411, without passing through an interconnect in an R/I layer adjacent to the first semiconductor layer 411. For example, information output from a synaptic core in the first semiconductor layer 411 may be provided directly to a fourth semiconductor layer 422, and the information may be provided to a third semiconductor layer 421 or a fifth semiconductor layer 431 via an interconnect of the fourth semiconductor layer 422.

Figure 9:
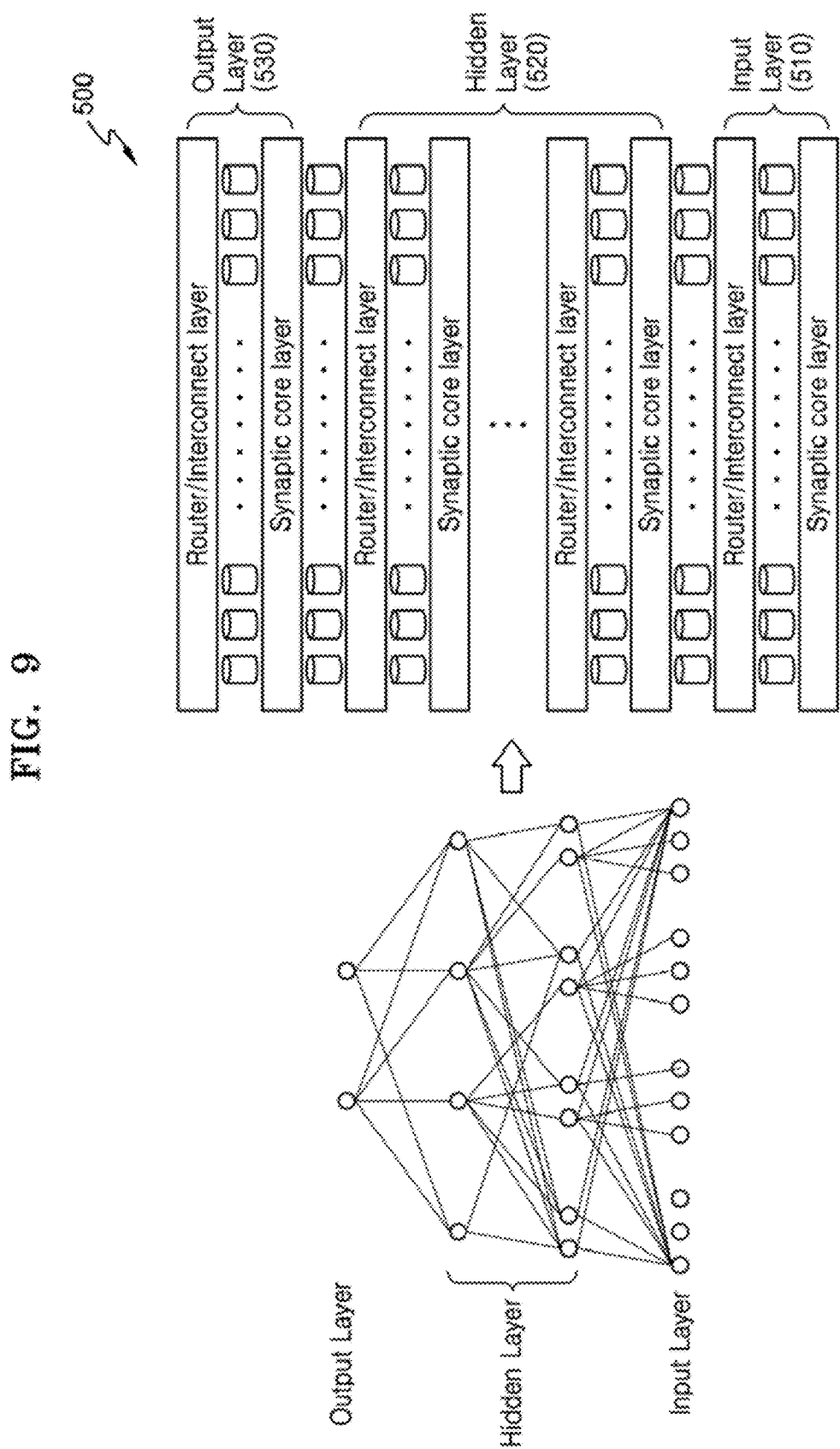
FIG. 9 is a block diagram illustrating an example in which a semiconductor device according to embodiments of the inventive concept performs neuromorphic computation.

FIG. 9 is a block diagram illustrating an example in which a semiconductor device 500 according to embodiments of the inventive concept performs neuromorphic computation. As in the above-described embodiments, the semiconductor device 500 includes a plurality of semiconductor layers, where the plurality of semiconductor layers may include synaptic core layers and router/interconnect layers that are alternately stacked.

Neuromorphic computation or neural network computation may be performed in a plurality of nodes as illustrated in FIG. 9. A result of a computation performed in nodes of any one layer may be provided to other nodes of a next layer. For example, a plurality of nodes may constitute an input layer, at least one hidden layer, and an output layer.

According to an embodiment, nodes performing neuromorphic computation may be implemented as a neural circuit and a synapse circuit included in a synaptic core, and information transfer between nodes may be performed by using a router/interconnect layer. For instance, an operation of providing a result of a computation performed by using input information and a weight from a node to another node, may include an operation of providing information from any one synaptic core of the semiconductor device 500 to a synaptic core of another semiconductor layer via a router/interconnect layer.

According to an embodiment, some of the semiconductor layers of the semiconductor device 500 may constitute an input layer 510 described above; some other semiconductor layers may constitute at least one hidden layer 520; and the remaining semiconductor layers may constitute an output layer 530. For example, one synaptic core layer and one router/interconnect layer in a lower portion may be included in the input layer 510, and a plurality of synaptic core layers and a plurality of router/interconnect layers located on the input layer 510 may be included in the hidden layer 520, and one synaptic core layer and one router/interconnect layer in an upper portion are included in the output layer 530. In an alternative example, semiconductor layers at predefined locations from among a plurality of semiconductor layers included in the semiconductor device 500 may also constitute the input layer 510, the hidden layer 520, and the output layer 530 described above.

A computation result from the input layer 510 may be provided to a synaptic core layer in the hidden layer 520 via a TSV. In addition, a computation result from any one synaptic core layer of the hidden layer 520 may be provided to another synaptic core layer of the hidden layer 520 or to a synaptic core layer in the output layer 530. In addition, a final computation result from the output layer 530 may be stored in the semiconductor device 500 or provided to the outside.

According to the embodiment illustrated in FIG. 9, under an assumption that neuromorphic computation includes a plurality of hierarchical computations, operation in nodes of the same layer (input, hidden or output layer) may be performed in a semiconductor layer or layers located at the same vertical region of the semiconductor device 500. Further, a result of the operation may be easily transferred to a semiconductor layer corresponding to nodes of another layer via a TSV. Because interconnects are disposed in a semiconductor layer at a different location from that of a semiconductor layer in which synaptic cores are formed, the interconnects may be implemented more easily. Moreover, information transfer efficiency may be increased.

Figure 10A:
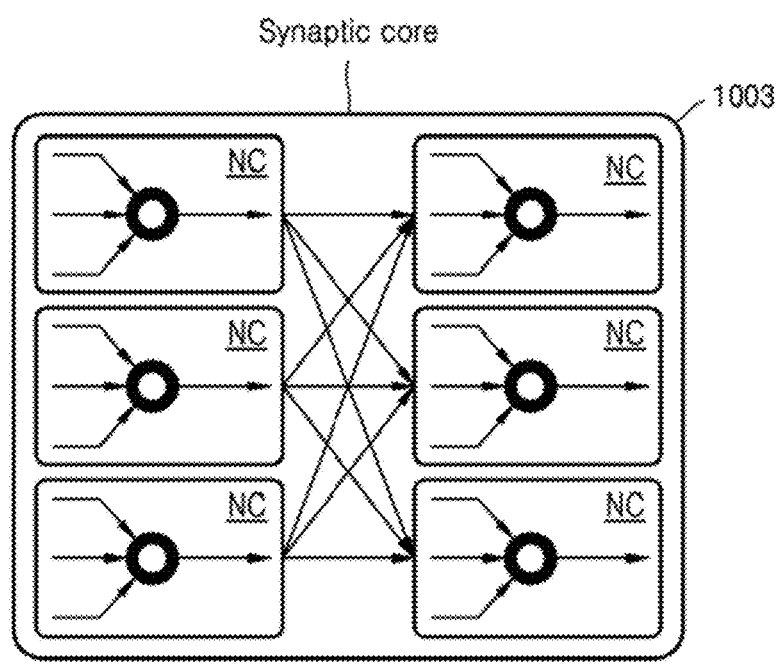
FIG. 10A schematically illustrates an example of a synaptic core that may be used in embodiments of the inventive concept.

FIG. 10A schematically illustrates an example of a synaptic core, 1003, that may be used for any of the synaptic cores in the embodiments herein. Synaptic core 1003 may include a plurality of neural circuits (NC), where some neural circuits may receive input information from outside synaptic core 1003, and may provide a result of predefined neuromorphic computation to at least one other neural circuit in the same synaptic core. In addition, some other neural circuits of the synaptic core 1003 may receive a computation result generated in the synaptic core as input information, and the computation result may be provided to other neural circuits in the synaptic core. Local routers (not shown) may be included within or outside any neural circuit to route the information to another, target neural circuit via local interconnects (the shown arrowed paths). Still other neural circuits in the synaptic core 1003 may provide a neuromorphic computation result to an external synaptic core(s).

Figure 10B:
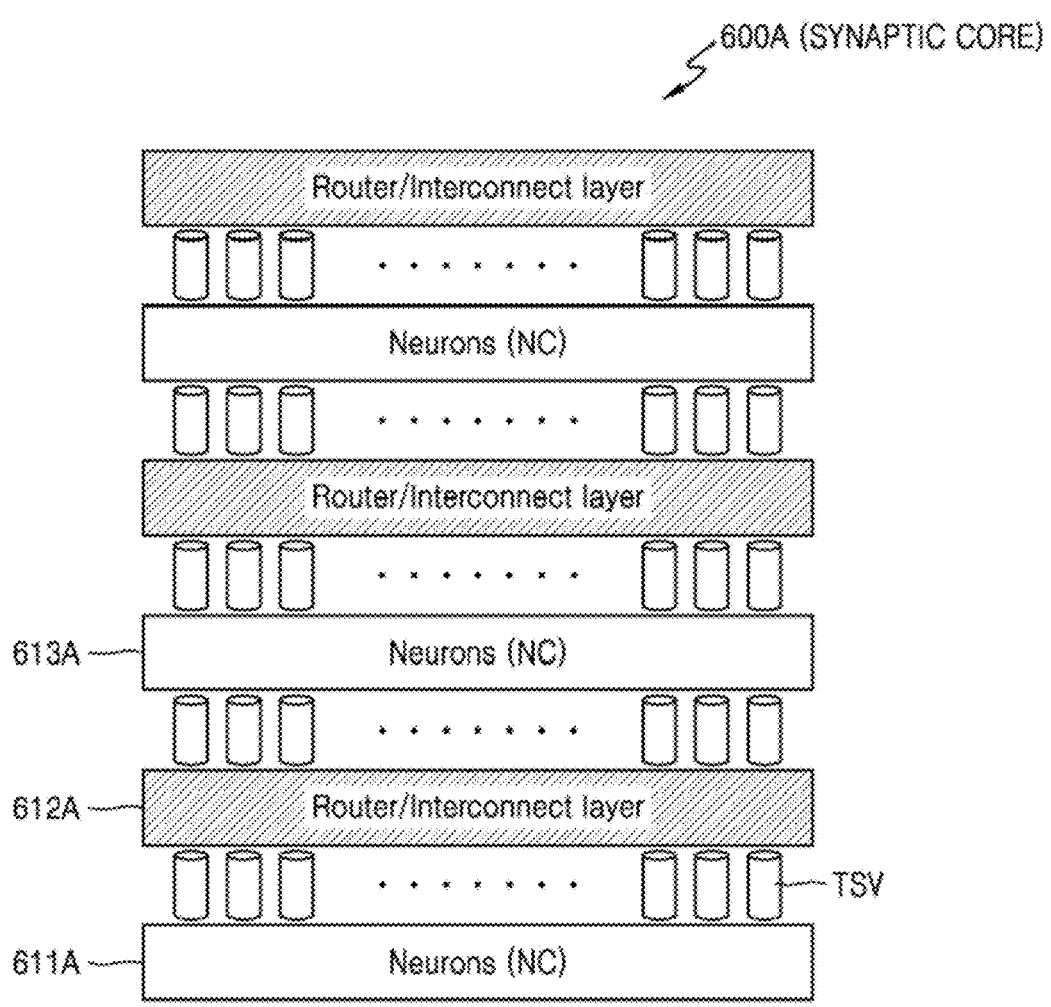
FIGS. 10B and 10C are configurational/block diagrams illustrating respective synaptic cores with circuit components thereof disposed in different semiconductor layers of a semiconductor device, according to embodiments of the inventive concept.
Figure 10C:
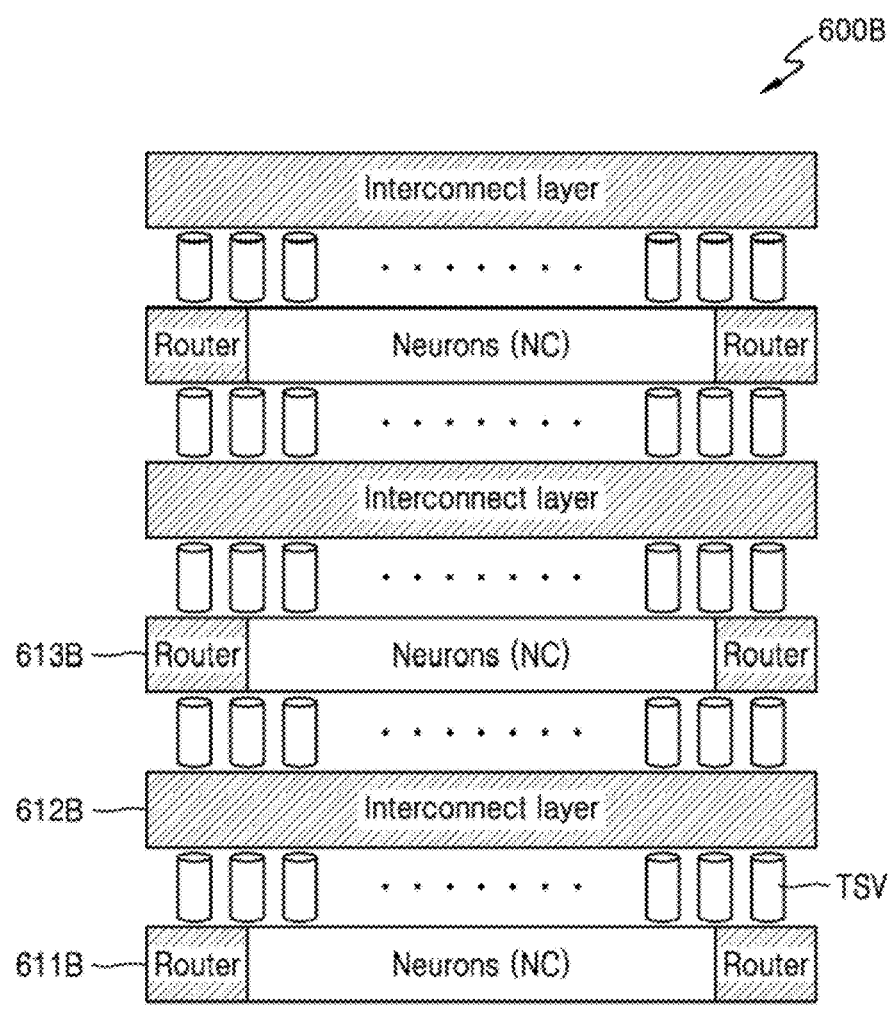

FIGS. 10B and 10C are configurational/block diagrams illustrating respective synaptic cores with circuit components thereof disposed in different semiconductor layers of a semiconductor device, according to the inventive concept. According to an embodiment of the inventive concept, circuit components of a single synaptic core may be spread across a plurality of semiconductor layers as illustrated in FIGS. 10B and 10C. In the embodiment of FIG. 10B, a first synaptic core 600A, which is an embodiment of synaptic core 1003, includes neural circuits NC, also called "neurons", distributed in a plurality of semiconductor layers; and router/interconnect (R/I) layers arranged in semiconductor layers different from those containing the neural circuits. For example, some neural circuits may be arranged in a first semiconductor layer 611A, other neural circuits may be arranged in a third semiconductor layer 613A, and a second semiconductor layer 612A, which is an R/I layer including a router/interconnect, may be disposed between the first and third semiconductor layers 611A, 613A. Here, the router and interconnect of the R/I layer is a local router and a local interconnect.

Meanwhile, referring to FIG. 10C, in a semiconductor device 600B, neural circuits and routers may be arranged in some of the semiconductor layers thereof, and interconnects may be arranged in some other semiconductor layers. For example, some neural circuits and routers may be arranged in a first semiconductor layer 611B; other neural circuits and routers may be arranged in a third semiconductor layer 613B; and a second semiconductor layer 612B in which an interconnect is arranged may be located between the first semiconductor layer 611B and the third semiconductor layer 613B.

According to the embodiments illustrated in FIGS. 10A, 10B, and 10C, a synaptic core having a three-dimensional stack structure formed by using at least two semiconductor layers may be implemented. That is, as a plurality of neural circuits included in one synaptic core and a local router and a local interconnect included for connection between the neural circuits are formed in a plurality of semiconductor layers according to the above-described embodiments, a synaptic core may be easily implemented and an information transfer efficiency may also be increased.

Figure 11A:
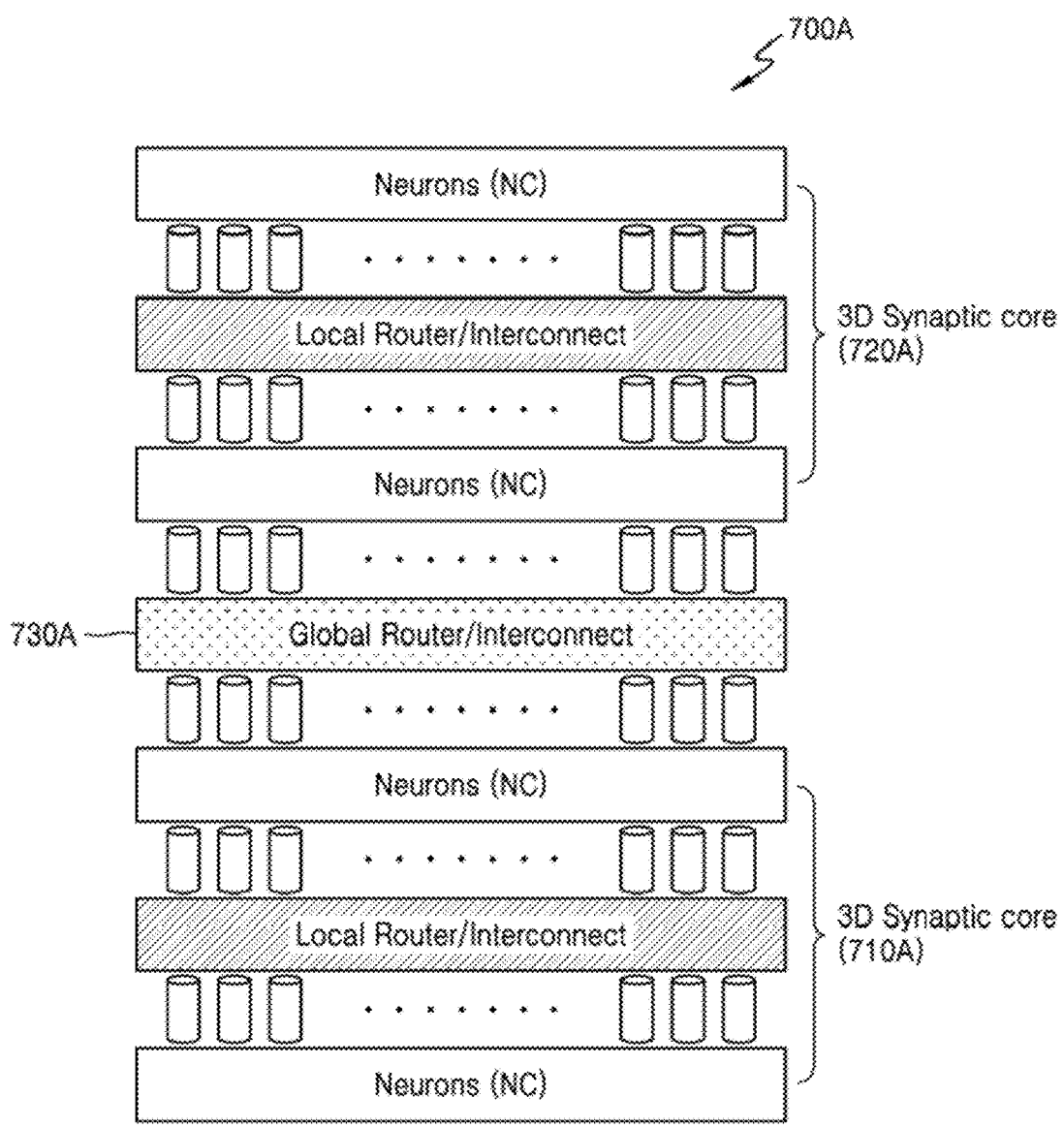
FIGS. 11A and 11B are configurational/block diagrams illustrating respective embodiments of a semiconductor device according to the inventive concept.
Figure 11B:
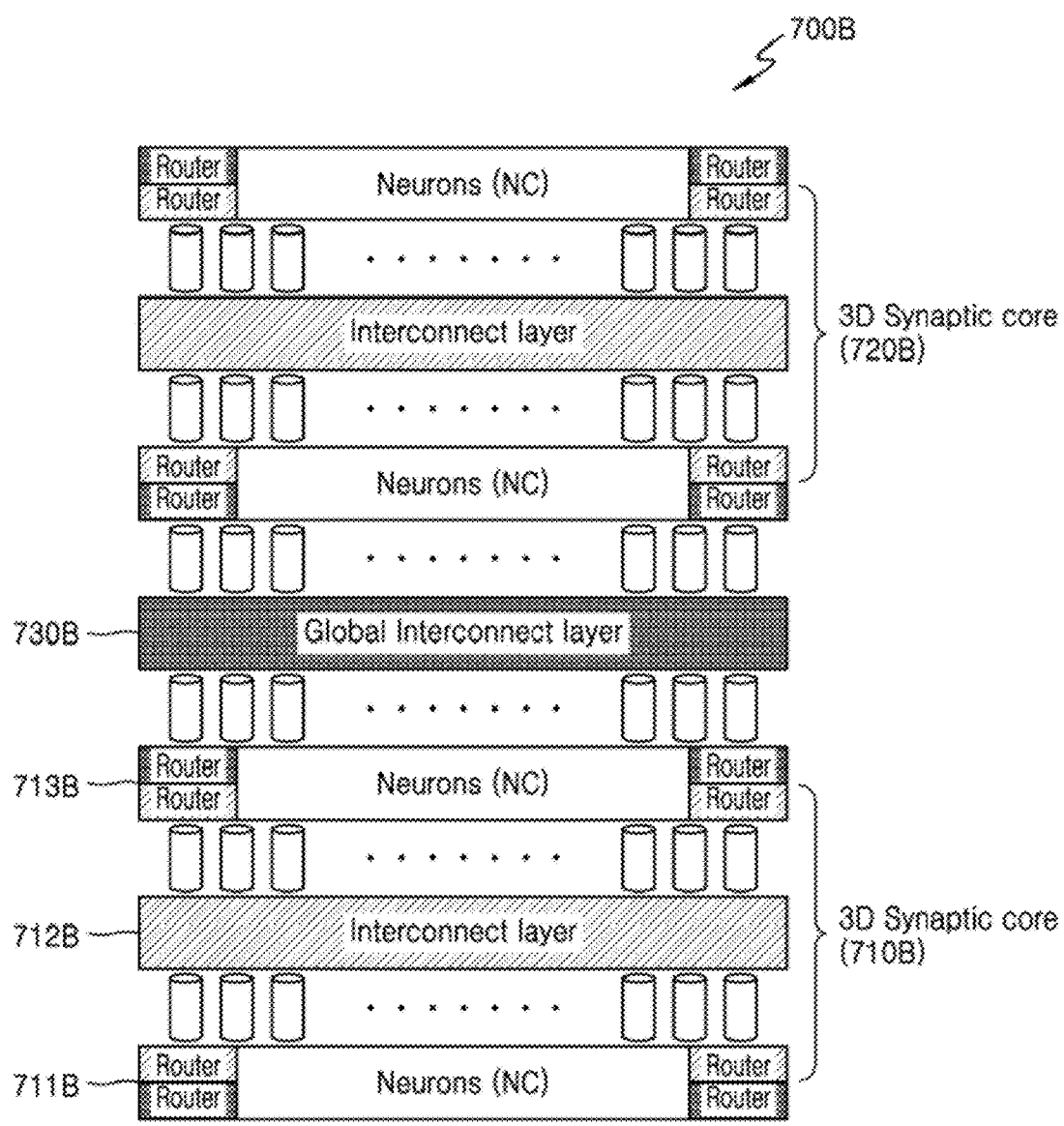

FIGS. 11A and 11B are configurational/block diagrams illustrating respective embodiments of a semiconductor device according to the inventive concept. In these devices, each synaptic core is implemented in a three-dimensional stack form, and connections between a plurality of synaptic cores are also implemented in a three-dimensional stack form.

Referring to FIG. 11A, a semiconductor device 700A may include a plurality of semiconductor layers which may include a plurality of synaptic cores and global router/interconnect layers between the synaptic cores. In the illustrated example, the semiconductor layers include multiple layers forming a first synaptic core 710A, multiple layers forming a second synaptic core 720A, and a global router/interconnect layer 730A between the first and second synaptic cores 710A and 720A. In other embodiments, semiconductor device 700A may include more synaptic cores and global router/interconnect layers.

In any of the synaptic cores 710A, 720A, neural circuits may be respectively formed in different semiconductor layers. Neural circuits in the same or different layers may transmit/receive information to each other via a local router/interconnect layer formed in an additional semiconductor layer. In addition, the first synaptic core 710A and the second synaptic core 720A may transmit or receive information to each other via the global router/interconnect layer 730A.

Referring to FIG. 11B, a first semiconductor layer 711B in which some neural circuits and local routers of a first synaptic core 710B are arranged and a third semiconductor layer 713B in which some other neural circuits and local routers of the first synaptic core 710B are arranged may have a three-dimensional stack structure, and a second semiconductor layer 712B including a local interconnect may be arranged between the first semiconductor layer 711B and the third semiconductor layer 713B. In addition, the first through third semiconductor layers 711B through 713B may transmit/receive information to or from each other via a TSV. Further, the first synaptic core 710B and the second synaptic core 720B may transmit or receive information to or from each other via a TSV and a global interconnect layer 730B.

According to an embodiment, local routers and global routers described above may be formed in the same semiconductor layer as a synaptic core (or neural circuits), and local interconnects and global interconnects may be formed in another semiconductor layer different from that of the synaptic core.

Information from some neural circuits of the first synaptic core 710B may be provided to other neural circuits in the first synaptic core 710B through local routers and local interconnects, and information from some other neural circuits of the first synaptic core 710B may be provided to neural circuits of the second synaptic core 720B through global routers and global interconnects.

According to the embodiments illustrated in FIGS. 11A and 11B, circuits in each of the above-described synaptic core units are formed with a three-dimensional stack structure, and circuits in a plurality of synaptic core units, when considered collectively, may also have a three-dimensional stack structure. Here, by arranging local interconnects and global connects at appropriate locations of a plurality of semiconductor layers, information transfer efficiency may be enhanced.

It is noted that while FIG. 11B illustrates that local routers and global routers are both formed in the same semiconductor layer as a synaptic core (or neural circuits), other configurations are available. For example, while a local router is formed in a same semiconductor layer as neural circuits, a global router may also be formed in the global interconnect layer 730B. Alternatively, while a global router is formed in a same semiconductor layer as neural circuits, a local router may also be formed in a same semiconductor layer as a local interconnect.

Figure 12A:
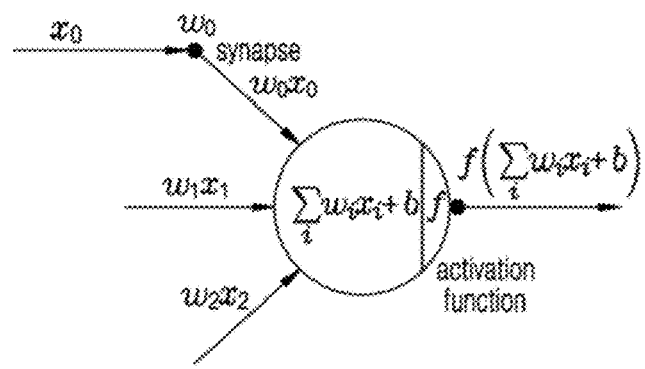
FIGS. 12A and 12B are signal and block diagrams, respectively, illustrating an example of a semiconductor device according to still another embodiment of the inventive concept.
Figure 12B:
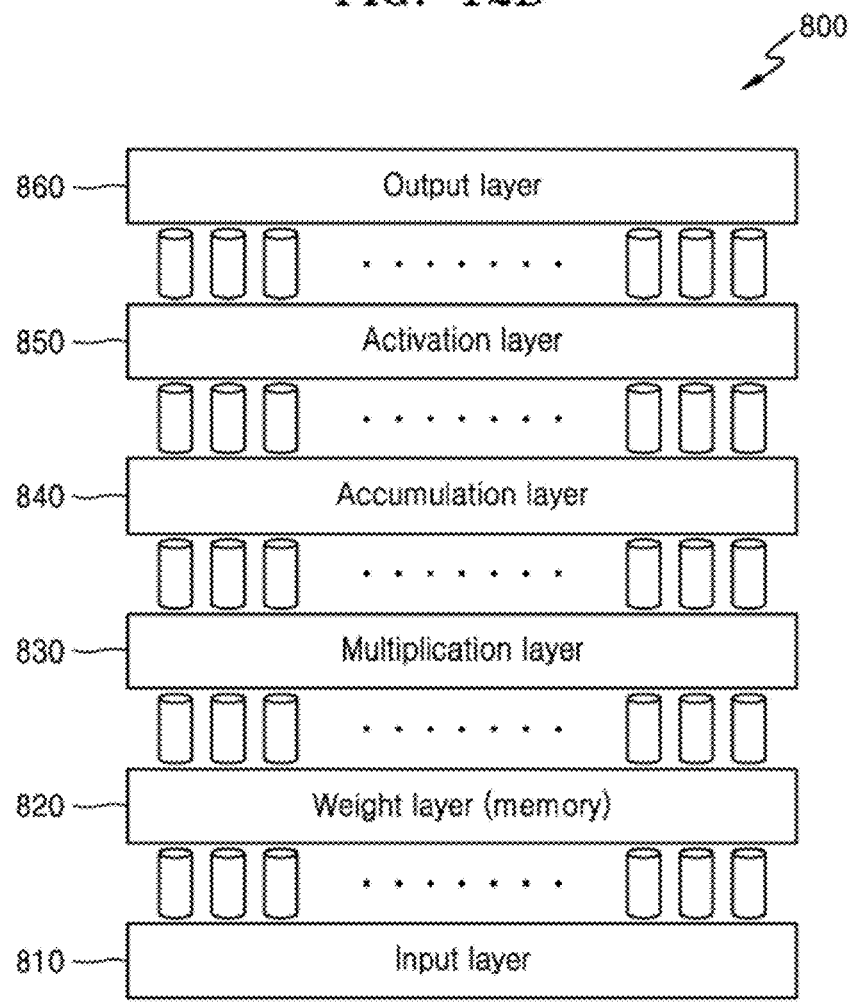

FIGS. 12A and 12B are signal and block diagrams, respectively, illustrating an example of a semiconductor device according to another embodiment of the inventive concept.

As illustrated in FIG. 12A, as an example of neuromorphic computation made by a semiconductor device, synapse weights ($\omega 0$, $\omega 1$, $\omega 2$) are multiplied with information represented by values (x0, x1, x2) from a plurality of neurons, and a summation operation ($\Sigma$) is performed on the multiplication results (w0x0, w1x1, . . . ). Further, a characteristic function (b) and an activation function (f) may be performed on a result of the summation operation, thereby providing a computation result.

FIG. 12B illustrates a semiconductor device 800 including a plurality of semiconductor layers and interconnects therebetween. The semiconductor layers may include an input layer 810 through which information from an outside source is received, a weight layer 820 storing weight information used for neuromorphic computation, a multiplication layer 830 in which multiplication based on weights is performed, an accumulation layer 840 in which an accumulation computation on multiplication results is performed, an activation layer 850 performing an activation function, and an output layer 860 from which a computation result is output. The activation function may correspond to various types of operations, and include, for example, sigmoid, ReLU (Rectified Linear Unit), hyper-tangent, and threshold.

Each of the semiconductor layers included in the semiconductor device 800 may include circuits used to perform corresponding operation processing, and for example, a computation circuit for performing analog or digital operations may be included in the semiconductor layers. In addition, according to the embodiment illustrated in FIG. 12B, various functions performed in accordance with any one neural circuit may be distributed to at least two semiconductor layers for implementation. The input layer 810 may receive a plurality of inputs via a semiconductor layer (not shown) in which routers and interconnects according to the above-described embodiments are formed. A computation result may be output from the output layer 860 through a semiconductor layer (not shown) in which the routers and the interconnects according to the above-described embodiments are formed.

Figure 13:
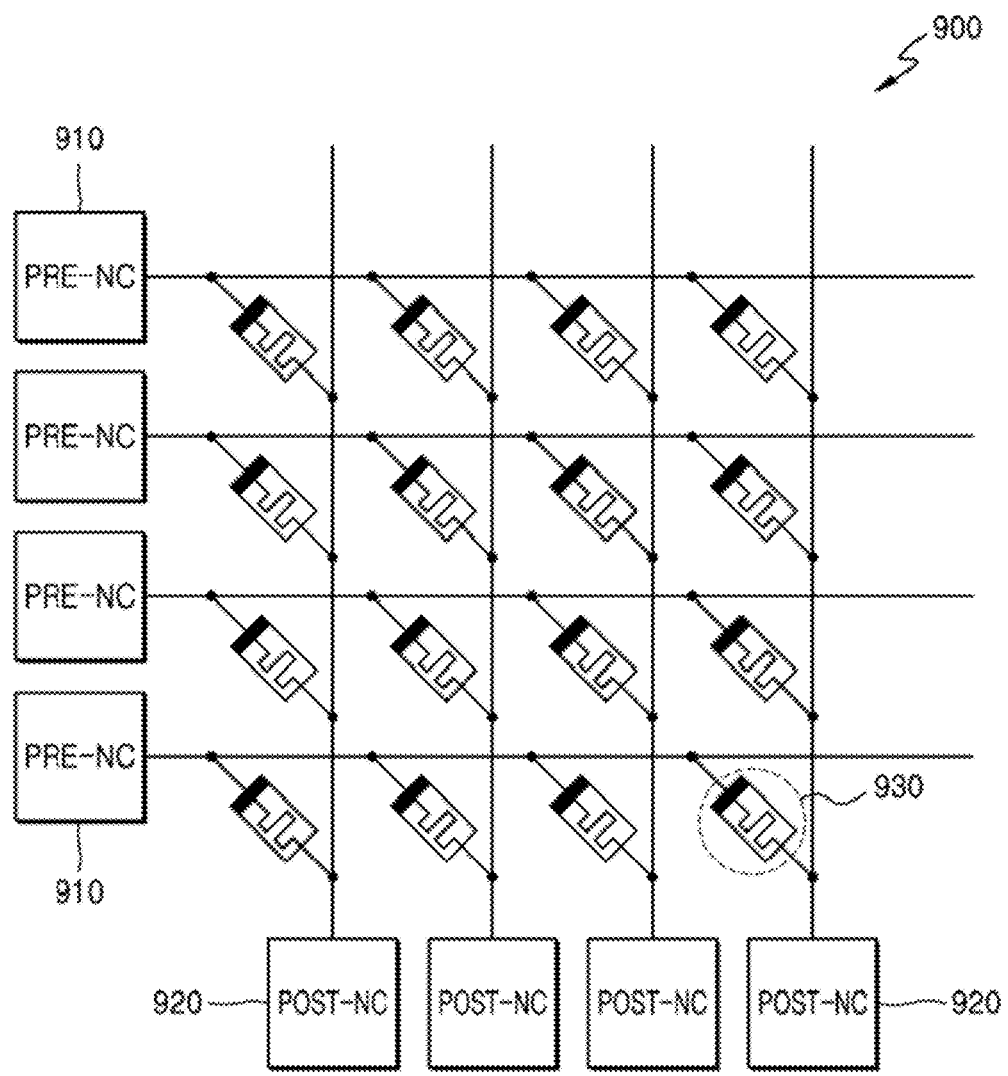
FIG. 13 is a circuit diagram illustrating an example of a neuromorphic circuit.

FIG. 13 is a circuit diagram illustrating an example of a neuromorphic circuit 900 according to an embodiment. The neuromorphic circuit 900 may be included in a synaptic core in any of the above-described embodiments.

Neuromorphic circuit 900 may include a plurality of neural circuits 910 and 920 and a plurality of synapse circuits 930 providing connection between the neural circuits. Neural circuits 910 and 920 may be pre-synaptic neural circuits (Pre-NC) 910 and post-synaptic neural circuits (Post-NC) 920, respectively. Synapse circuits 930 may be arranged in an area where the pre-synaptic neural circuits 910 and the post-synaptic neural circuits 920 intersect each other. While the neuromorphic circuit 900 having a matrix structure including four pre-synaptic neural circuits 910 and four post-synaptic neural circuits 920 is illustrated in FIG. 13, the neuromorphic circuit 900 may include any suitable number of neural circuits.

Meanwhile, the synapse circuits 930 may include various types of memories, and for example, weights may be stored in the synapse circuits 930 through memrister-based design. A multiplication computation may be performed at points of intersection of the pre-synaptic neural circuits 910 and the post-synaptic neural circuits 920. Some examples of the types of memories used to implement the neuromorphic circuit 900 include DRAM and SRAM using a CMOS transistor technique, phase change RAM (PRAM), phase-change memory (PCM), resistive RAM (ReRAM), magnetic RAM (MRAM), a spin transfer torque magnetic RAM (STT-MRAM) using a resistive memory technique, or the like.

As an operation example, the pre-synaptic neural circuits 910 may output input data to the synapse circuits 930, and the synapse circuits 930 may vary conductance of a memrister based on a predefined threshold voltage, and a connection intensity between the pre-synaptic neural circuits 910 and the post-synaptic neural circuits 920 may be varied based on a result of varying the conductance. For example, when conductance of a memrister increases, an intensity of connection between a pre-synaptic neural circuit and a post-synaptic neural circuit corresponding to the memrister may increase; when conductance of the memrister decreases, an intensity of connection between a pre-synaptic neural circuit and a post-synaptic neural circuit corresponding to the memrister may decrease. A weight may be applied to signals provided to the post-synaptic neural circuits 920 based on conductance of a memrister of the synapse circuits 930. A result obtained by assigning a weight to each piece of input data (or by multiplying a weight by each piece of input data) may be provided to the post-synaptic neural circuits 920. Although not illustrated in FIG. 13, elements for implementing other functions associated with neural network computation (for example, activation function operation) may be further included in the neuromorphic circuit 900.

Figure 14:
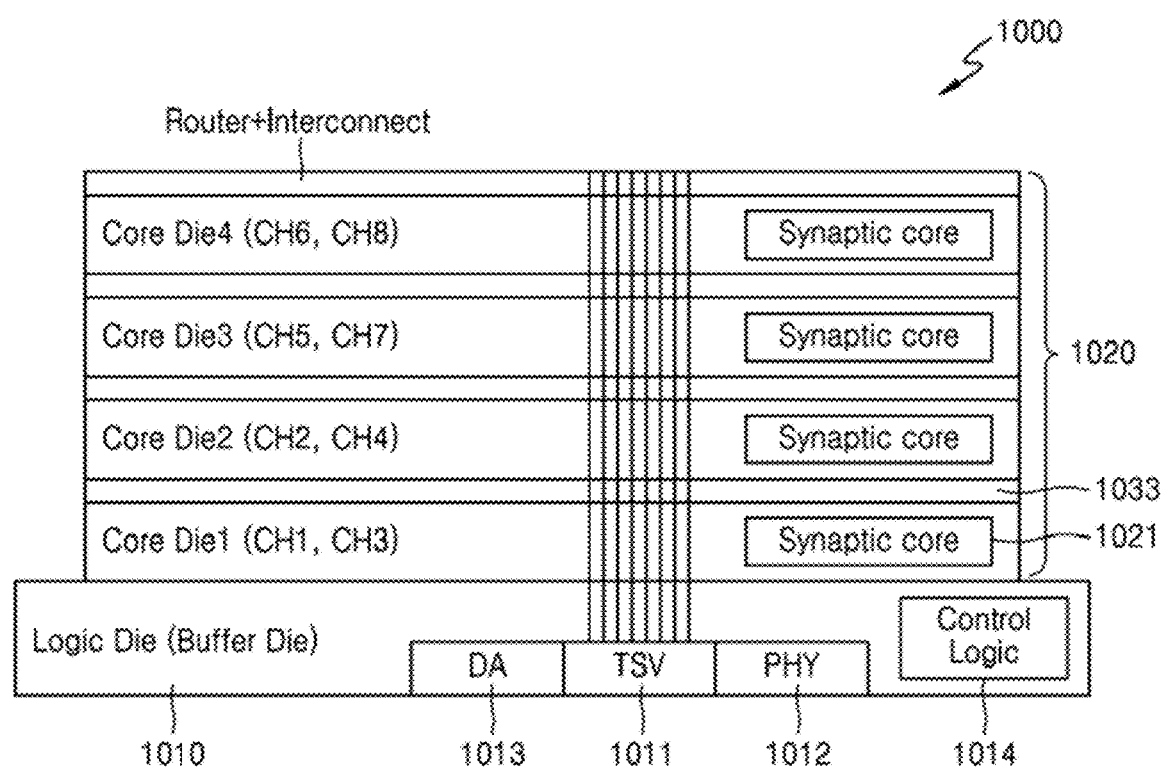
FIG. 14 is a block diagram illustrating an example in which a semiconductor device according to embodiments of the inventive concept is embodied as a high bandwidth memory (HBM)

FIG. 14 is a block diagram illustrating an example in which a semiconductor device according to embodiments of the inventive concept is embodied as a high bandwidth memory (HBM) 1000. The HBM 1000 may include a logic die (or buffer die) 1010 including control logic 1014 for a memory operation and for controlling a neuromorphic computation and core dies 1020 each including a memory cell array. A synaptic core 1021 for neuromorphic computation may be respectively arranged in the core dies 1020. The HBM 1000 may have a greater bandwidth by including a plurality of channels having independent interfaces to each other. In the example of FIG. 14, the HBM 1000 includes four core dies 1020, and each of the core dies 1020 includes two channels, but any suitable number of core dies and channels may be provisioned. (In a minimal case, only one core die may be included).

The logic die 1010 may further include a TSV area 1011, a physical area PHY 1012, and a direct access area 1013. The control logic 1014 controls overall operations in the HBM 1000, and may perform, for example, an internal control operation in response to a command from an external controller.

TSV area 1011 corresponds to an area where a TSV is formed for communication with the core dies 1020. The physical area PHY 1012 may include a plurality of input circuits for communication with an external controller, and the direct access area 1013 may directly communicate with an external tester via a conductive unit arranged on an external surface of the HBM 1000. Various signals provided by the tester may be provided to core dies 1020 through the direct access area 1013 and the TSV area 1011. Alternatively, according to a modifiable embodiment, various signals provided from a tester may be provided to the core dies 1020 via the direct access area 1013, the physical area PHY 1012, and the TSV area 1011.

According to an embodiment of the inventive concept, each of the core dies 1020 may include a plurality of synaptic cores 1021, and information from a synaptic core of any one core die (or a computation result) may be provided to a synaptic core of another core die. In addition, a semiconductor layer in which a router and an interconnect according to the above-described embodiment are arranged may be formed on each of the core dies 1020.

For example, a first core die Core Die 1 and a second core die Core Die 2, information from a first synaptic core of the first core die Core Die 1 may be provided to the second core die Core Die 2 through a TSV of the TSV area 1011 and a router/interconnect layer 1033. For example, information from the first synaptic core may be provided to a synaptic core of the same core die Core Die 1 through the TSV of the TSV area 1011 or to any one synaptic core of other core dies.

According to the embodiment illustrated in FIG. 14, as the HBM 1000 having a greater bandwidth is used in performing neuromorphic computation, the bandwidth of the channels may be efficiently used in computing large-capacity data, and data latency may be reduced.

Figure 15:
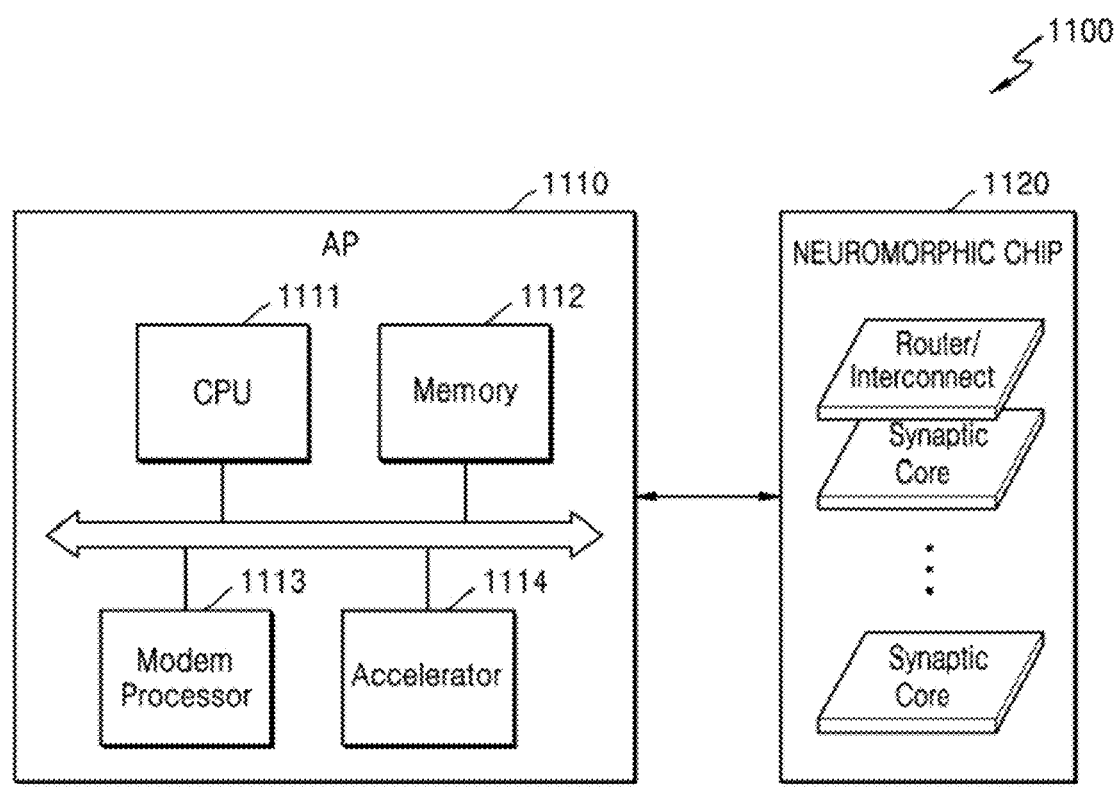
FIG. 15 is a block diagram illustrating an example of a mobile device including a neuromorphic chip according to an embodiment of the inventive concept.

FIG. 15 is a block diagram illustrating an example of a mobile device, 1100, including a neuromorphic chip according to an embodiment of the inventive concept. The mobile device 1100 is an example of a data processing system, and may include an application processor 1110 and a neuromorphic chip 1120. The application processor 1110 may be implemented as a system on chip (SoC). The system on chip (SoC) may include a system bus (not shown) to which a protocol having predefined bus standards is applied, and may include various Intellectual Properties (IP) connected to the system bus. As the standards for a system bus, an Advanced Microcontroller Bus Architecture (AMBA) protocol available by Advanced RISC Machine (ARM) may be applied. Examples of bus types of the AMBA protocol may include, for example, Advanced High-Performance Bus (AHB), Advanced Peripheral Bus (APB), Advanced eXtensible Interface (AXI), AXI4, or AXI Coherency Extensions (ACE). In addition, other types of protocols such as uNetwork by SONICs® Inc. or CoreConnect by IBM®, or open core protocol by the OCP-IP may also be applied.

The application processor 1110 may include a central processing unit 1111 and a hardware accelerator 1114 related to neuromorphic computation or neural network computation. While FIG. 15 illustrates one hardware accelerator 1114, the application processor 1110 may include two or more hardware accelerators of various types. In addition, the application processor 1110 may further include a memory 1112 storing instructions to control an overall operation of the mobile device 1100. In addition, the application processor 1110 may further include a modem processor 1113 as an element for controlling a modem communication function, and the application processor 1110 including the modem processor 113 may also be referred to as ModAP.

The neuromorphic chip 1120 may include a semiconductor device according to the above-described embodiments. For example, the neuromorphic chip 1120 may be a semiconductor package or a semiconductor chip having a stack structure of a plurality of semiconductor layers. For example, the neuromorphic chip 1120 may include at least one synaptic core layer in which synaptic cores according to the above-described embodiments are formed and a router/interconnect layer arranged to correspond to the synaptic core layer. According to the above-described embodiments, the neuromorphic chip 1120 may also be implemented such that synaptic cores and routers are formed in a same semiconductor layer, and interconnects are formed in an additional semiconductor layer.

According to the above-described embodiments, a plurality of semiconductor layers included in the neuromorphic chip 1120 may communicate with each other via through electrodes such as a TSV, and information from a synaptic core of any one semiconductor layer of an embodiment of the inventive concept may be provided to a synaptic core of another semiconductor layer through a TSV and a router/interconnect layer.

In the above-described embodiments, through silicon vias (TSVs) have been described as an example of a through electrode (the latter also known as a via (vertical interconnected access)) but other types of through electrodes may be substituted for the TSVs.

Circuitry and interconnection arrangements exemplified above may be applied to other semiconductor devices such as an integrated circuit with a large number of parallel processing elements of a parallel processing system that employs routers to communicate information and control signals and share tasks with one another. The processing elements, disposed in semiconductor layers akin to the description above for the synaptic cores (which are themselves examples of processing elements), may be selectively and dynamically interconnected with each other through use of the global routers, global interconnects and TSVs in the same manner as described above for the synaptic cores.

While the inventive concept has been particularly shown and described with reference to embodiments thereof, it will be understood that various changes in form and details may be made therein without departing from the spirit and scope of the following claims.

What is claimed is:

1. A semiconductor device comprising:
a first semiconductor layer comprising one or more synaptic cores, each synaptic core comprising neural circuits to perform neuromorphic computation;
a second semiconductor layer stacked on the first semiconductor layer and comprising an interconnect forming a physical transfer path between synaptic cores;
a third semiconductor layer stacked on the second semiconductor layer and comprising one or more synaptic cores; and
one or more through electrodes, through which information is transferred between the first through third semiconductor layers,
wherein, based on a routing of the second semiconductor layer, a result of a neuromorphic computation from a first synaptic core in the first semiconductor layer is transferred to a second synaptic core in the third semiconductor layer or a third synaptic core in the first semiconductor layer via the one or more through electrodes and the interconnect of the second semiconductor layer.

2. The semiconductor device of claim 1, wherein the through electrode is a through silicon via (TSV).

3. The semiconductor device of claim 1, wherein the second semiconductor layer further comprises a router for determining an information transfer path between the synaptic cores.

4. The semiconductor device of claim 1, wherein each of the first and third semiconductor layers further comprises a router for determining an information transfer path between the synaptic cores.

5. The semiconductor device of claim 1, wherein each synaptic core further comprises a local router for determining an information transfer path between the neural circuits and a local interconnect forming a physical information transfer path in each synaptic core.

6. The semiconductor device of claim 5, wherein the synaptic cores further comprise memristers for storing synapse information and performing weight computation by using the synapse information.

7. The semiconductor device of claim 1, wherein first information from the first synaptic core in the first semiconductor layer is transferred to the second synaptic core in the third semiconductor layer through the interconnect of the second semiconductor layer, and
second information from the first synaptic core in the first semiconductor layer is transferred to a third synaptic core in the first semiconductor layer through an interconnect of the second semiconductor layer.

8. The semiconductor device of claim 1, wherein the semiconductor device comprises N semiconductor layers including the first through third semiconductor layers, where N is an integer greater than 3, and wherein the N semiconductor layers are implemented such that semiconductor layers each including a synaptic core, and semiconductor layers each including an interconnect, are alternately stacked.

9. The semiconductor device of claim 1, wherein the one or more through electrodes is formed within at least one of the first, second or third semiconductor layers.

10. A semiconductor device comprising:

a first semiconductor layer comprising one or more synaptic cores, each synaptic core comprising neural circuits to perform neuromorphic computation;

a second semiconductor layer stacked on the first semiconductor layer and comprising an interconnect forming a physical transfer path between synaptic cores;

a third semiconductor layer stacked on the second semiconductor layer and comprising one or more synaptic cores; and one or more through electrodes, through which information is transferred between the first through third semiconductor layers, wherein information from a first synaptic core in the first semiconductor layer is transferred to a second synaptic core in the third semiconductor layer via the one or more through electrodes and the interconnect of the second semiconductor layer, wherein the neuromorphic computation comprises a computation of nodes having a plurality of layer structures, and a computation result of first nodes from among the nodes and belonging to a first layer, is provided to second nodes from among the nodes and belonging to a second layer, wherein the first nodes are included in the first synaptic core of the first semiconductor layer, and the second nodes are included in the second synaptic core of the third semiconductor layer.

11. A neuromorphic circuit comprising:

a synaptic core layer comprising a plurality of synaptic cores, each synaptic core comprising a plurality of neural circuits and a memory array storing synapse information;

global routers each configured to determine an information transfer path between the synaptic cores; and a global interconnect layer forming a physical transfer path between the global routers, wherein the synaptic core layer and the global interconnect layer are arranged in a stack structure, and information from a synaptic core of the synaptic core layer is transferred to the global interconnect layer via one or more through electrodes, wherein each of the synaptic cores comprises a local router determining an information transfer path between the neural circuits and a local interconnect forming a physical information transfer path in each of the synaptic cores, wherein the synaptic core layer comprises first through third semiconductor layers that have a stacked structure and communicate with each other via through electrodes, wherein some of a plurality of neural circuits of any one synaptic core are formed in the first semiconductor layer, the local interconnect is formed in the second semiconductor layer stacked on the first semiconductor layer, and other ones of the plurality of neural circuits are formed in the third semiconductor layer.

12. The neuromorphic circuit of claim 11, wherein the through electrode is a through silicon via (TSV).

13. The neuromorphic circuit of claim 11, wherein the global routers are integrated in the synaptic core layer with the synaptic cores.

14. The neuromorphic circuit of claim 11, wherein the global routers are integrated in the global interconnect layer along with a global interconnect.

15. The neuromorphic circuit of claim 14, wherein the neuromorphic circuit comprises first through Nth semiconductor layers (where N is an integer greater than 2) including the synaptic core layer and the global interconnect layer, the first semiconductor layer is the synaptic core layer, and the second semiconductor layer is the global interconnect layer, and the first through Nth semiconductor layers are implemented such that synaptic core and global interconnect layers thereof are alternately stacked.

16. The neuromorphic circuit of claim 11, wherein the local router is formed in the second semiconductor layer along with the local interconnect.

17. The neuromorphic circuit of claim 11, wherein the local router is formed in the first semiconductor layer and the third semiconductor layer along with the neural circuits.

18. The neuromorphic circuit of claim 11, wherein the memory array comprises memristers.

19. The neuromorphic circuit of claim 11, wherein the one or more through electrodes is formed within at least one of the synaptic core layer or the global interconnect layer.

20. An operating method of a semiconductor device, wherein the semiconductor device comprises a plurality of semiconductor layers with circuitry communicating with each other via a through silicon via (TSV), the operating method comprising:

transferring information from a first synaptic core including a plurality of neural circuits formed in a first semiconductor layer to a first router associated with the first synaptic core;

transferring the information from the first router to a second router via an interconnect formed in a second semiconductor layer stacked on the first semiconductor layer; and transferring the information from the second router to a second synaptic core formed in a third semiconductor layer stacked on the second semiconductor layer, the second synaptic core being associated with the second router.

21. The operating method of claim 20, wherein the information is a result of neuromorphic computation performed using the neural circuits with respect to input information provided to the first synaptic core.

22. The operating method of claim 20, wherein the information is first information, and the operating method further comprising:

transferring second information from the first synaptic core to a third router through an interconnect of the second semiconductor layer; and transferring the second information to a third synaptic core formed in the first semiconductor layer and arranged to correspond to the third router.

23. The operating method of claim 20, wherein path information for determining a transfer path of the information is further transferred from the first synaptic core to the first router, wherein the information is selectively transferred to the first semiconductor layer or the third semiconductor layer based on the path information.

24. The operating method of claim 20, wherein the first router and the second router are formed in the second semiconductor layer.

25. The operating method of claim 20, wherein the first router is formed in the first semiconductor layer, and the second router is formed in the third semiconductor layer.

26. A semiconductor device comprising:
   a first semiconductor layer comprising processing elements of a parallel processing system;
   a second semiconductor layer stacked on the first semiconductor layer and comprising an interconnect forming a physical transfer path between processing elements;
   a third semiconductor layer stacked on the second semiconductor layer and comprising processing elements;
   one or more through electrodes disposed within at least one of the first, second and third layers, through which information is transferred between the first through third semiconductor layers;
   a plurality of routers, each associated with one of the processing elements and each for determining an information transfer path between the associated processing element and another one of the processing elements,
   wherein information from a first processing element in the first semiconductor layer is transferred to a second processing element in the third semiconductor layer via the one or more through electrodes and the interconnect of the second semiconductor layer.

27. The semiconductor device of claim 26, wherein the at least one through electrode extends continuously from the first semiconductor layer to the third semiconductor layer.

* * * * *